US011450523B2

United States Patent
Tanoue

(10) Patent No.: US 11,450,523 B2
(45) Date of Patent: Sep. 20, 2022

(54) SUBSTRATE PROCESSING SYSTEM WITH ECCENTRICITY DETECTION DEVICE AND SUBSTRATE PROCESSING METHOD

(71) Applicant: Tokyo Electron Limited, Tokyo (JP)

(72) Inventor: Hayato Tanoue, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/049,076

(22) PCT Filed: Apr. 17, 2019

(86) PCT No.: PCT/JP2019/016467
§ 371 (c)(1),
(2) Date: Oct. 20, 2020

(87) PCT Pub. No.: WO2019/208359
PCT Pub. Date: Oct. 31, 2019

(65) Prior Publication Data
US 2021/0242010 A1    Aug. 5, 2021

(30) Foreign Application Priority Data
Apr. 27, 2018 (JP) .............................. JP2018-087713

(51) Int. Cl.
*H01L 21/02* (2006.01)
*B23K 26/53* (2014.01)
(Continued)

(52) U.S. Cl.
CPC ........ *H01L 21/02021* (2013.01); *B23K 26/53* (2015.10); *H01L 21/268* (2013.01);
(Continued)

(58) Field of Classification Search
CPC ............. H01L 21/02021; H01L 21/268; H01L 21/304; H01L 21/67092; H01L 21/67115;
(Continued)

(56) References Cited

U.S. PATENT DOCUMENTS

2006/0079155 A1* 4/2006 Nakamura ............. B23K 26/40
                                                              451/41
2015/0140785 A1   5/2015 Kwak et al.
(Continued)

FOREIGN PATENT DOCUMENTS

JP         09216152 A      8/1997
JP       2004111606 A      4/2004
(Continued)

OTHER PUBLICATIONS

English Translation of the Written Opinion of the International Searching Authority for PCT/JP2019/016467. Available online dated Oct. 27, 2020; 11 total pages. (Year: 2020).*
(Continued)

*Primary Examiner* — John P. Dulka
(74) *Attorney, Agent, or Firm* — Brundidge & Stanger, P.C.

(57) ABSTRACT

A substrate processing system configured to process a substrate includes an eccentricity detection device configured to detect, in a combined substrate in which a first substrate and a second substrate are bonded to each other, an eccentricity of the first substrate; a modification layer forming device configured to form a modification layer within the first substrate along a boundary between a peripheral portion to be removed and a central portion of the first substrate; and a periphery removing device configured to remove the peripheral portion starting from the modification layer.

18 Claims, 18 Drawing Sheets

(51) Int. Cl.
    *H01L 21/268*     (2006.01)
    *H01L 21/304*     (2006.01)
    *H01L 21/67*     (2006.01)
    *H01L 21/687*     (2006.01)

(52) U.S. Cl.
    CPC ...... *H01L 21/304* (2013.01); *H01L 21/67092* (2013.01); *H01L 21/67115* (2013.01); *H01L 21/67288* (2013.01); *H01L 21/68764* (2013.01)

(58) Field of Classification Search
    CPC ......... H01L 21/67288; H01L 21/68764; H01L 21/02002; H01L 22/00; H01L 21/67259; H01L 21/68; B23K 26/53; B23K 26/0604; B23K 26/57; B23K 26/0622; B23K 26/0006; B23K 26/032; B23K 26/0823; B23K 26/0853; B23K 26/0884
    See application file for complete search history.

(56) References Cited

U.S. PATENT DOCUMENTS

| | | | |
|---|---|---|---|
| 2018/0076043 A1* | 3/2018 | Ito | B24B 9/065 |
| 2018/0236597 A1* | 8/2018 | Okuma | B23K 26/03 |
| 2019/0001433 A1* | 1/2019 | Yamamoto | B23K 26/0006 |
| 2020/0343095 A1* | 10/2020 | Harada | B23K 26/36 |
| 2021/0193453 A1* | 6/2021 | Wu | H01L 21/3043 |

FOREIGN PATENT DOCUMENTS

| | | |
|---|---|---|
| JP | 2006108532 A | 4/2006 |
| JP | 2007036185 A | 2/2007 |
| JP | 2009131942 A | 6/2009 |
| JP | 2009135342 A | 6/2009 |
| JP | 2011159798 A | 8/2011 |
| JP | 2012064667 A | 3/2012 |
| JP | 2014107448 A | 6/2014 |
| JP | 2014167966 A | 9/2014 |
| JP | 2016004799 A | 1/2016 |
| JP | 2017022246 A | 1/2017 |
| JP | 2017071074 A | 4/2017 |
| JP | 2017191825 A | 10/2017 |
| JP | 2017204626 A | 11/2017 |
| JP | 2018043340 A | 3/2018 |

OTHER PUBLICATIONS

International Search Report of PCT/JP2019/016467 dated Jul. 23, 2019.

* cited by examiner

SUBSTRATE PROCESSING SYSTEM WITH ECCENTRICITY DETECTION DEVICE AND SUBSTRATE PROCESSING METHOD

TECHNICAL FIELD

This application claims the benefit of Japanese Patent Application Nos. 2018-087713 filed on Apr. 27, 2018, the entire disclosures of which are incorporated herein by reference.

The various aspects and embodiments described herein pertain generally to a substrate processing system and a substrate processing method.

BACKGROUND

It is described in Patent Document 1 that a disk-shaped grinding tool having abrasive grains on an outer peripheral portion thereof is rotated and at least an outer circumferential surface of the grinding tool is brought into linear contact with a semiconductor wafer to grind a circumferential end of the semiconductor wafer into a substantially L-shape. The semiconductor wafer is manufactured by bonding two sheets of silicon wafers.

PRIOR ART DOCUMENT

Patent Document 1: Japanese Patent Laid-open Publication No. H09-216152

DISCLOSURE OF THE INVENTION

Problems to be Solved by the Invention

Means For Solving the Problems

In one exemplary embodiment, a substrate processing system configured to process a substrate includes an eccentricity detection device configured to detect, in a combined substrate in which a first substrate and a second substrate are bonded to each other, an eccentricity of the first substrate; a modification layer forming device configured to form a modification layer within the first substrate along a boundary between a peripheral portion to be removed and a central portion of the first substrate; and a periphery removing device configured to remove the peripheral portion starting from the modification layer.

Effect of the Invention

DETAILED DESCRIPTION

Figure 1:
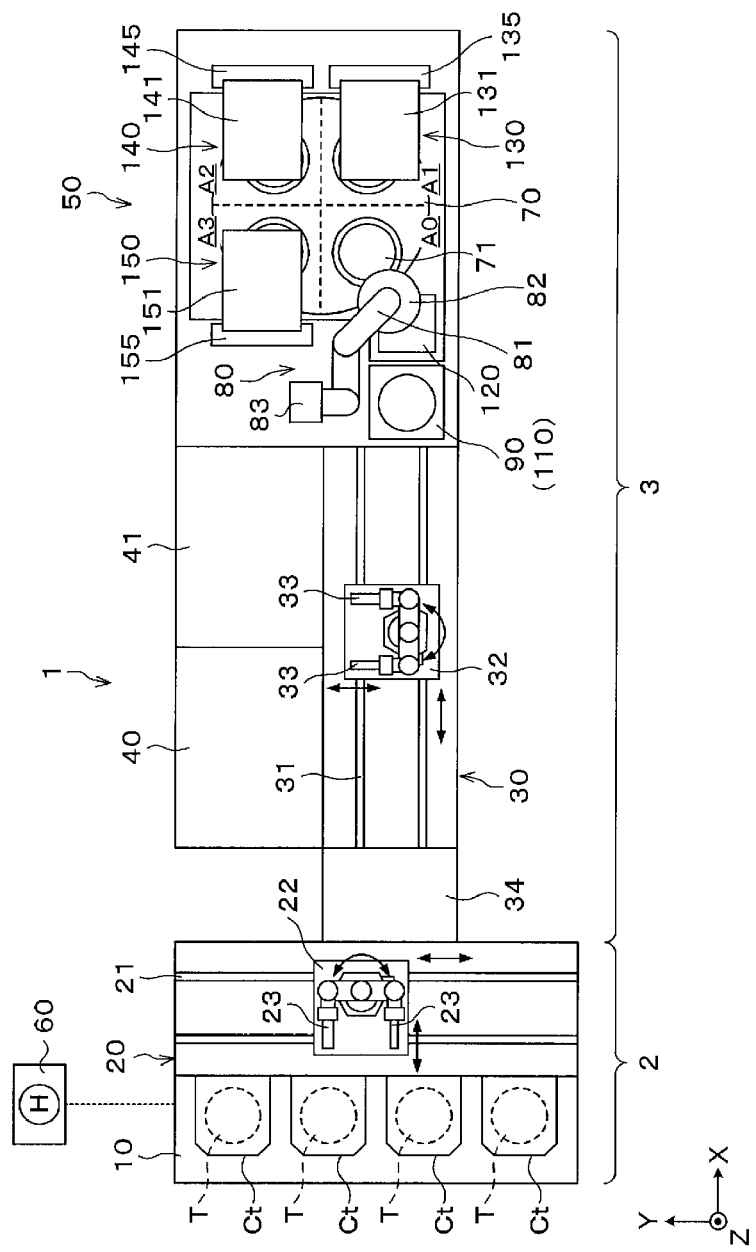
FIG. 1 is a schematic plan view illustrating a configuration of a substrate processing system according to an exemplary embodiment.

First, the conventional end face grinding device disclosed in Patent Document 1 will be described. The end face grinding device includes a chuck table, a spindle and a diamond wheel. The chuck table is configured to place a wafer thereon and is rotated around a Z-axis direction (vertical direction) as a rotation axis. The spindle is equipped with the diamond wheel at a tip end thereof and is rotated around a Y-axis direction (horizontal direction). Further, the spindle moves in the Y-axis direction and in the Z-axis direction. The diamond wheel is a disk-shaped grinding tool having diamond abrasive grains on an outer peripheral portion thereof. When an end face of a peripheral portion of a wafer is ground by using this end face grinding device, the diamond wheel is brought into contact with the wafer by moving the spindle in the Y-axis direction and in the Z-axis direction while rotating the chuck table. As a result, the peripheral portion of the wafer is ground into a substantially L-shape.

Here, in a manufacturing process for a semiconductor device, a semiconductor wafer having, for example, a plurality of electronic circuits on a front surface thereof is thinned by grinding a rear surface of the wafer. Then, if the thinned wafer is transferred or subjected to a subsequent processing as it is, bending or crack may occur in the wafer. Therefore, in order to reinforce the wafer, for example, bonding of the wafer to a support substrate is performed.

A peripheral portion of a wafer is typically chamfered, and if the wafer is ground as described above, the peripheral portion of the wafer has a sharply pointed shape (so-called "knife edge shape"). In this case, the peripheral portion of the wafer may be chipped and the wafer can be damaged. Therefore, before the grinding processing, trimming of the peripheral portion of the wafer (so-called "edge trimming") is performed.

The above-described end face grinding device disclosed in Patent Document 1 is configured to perform the edge trimming. However, in this end face grinding device, movements of the spindle in the Z-axis direction may not be uniform due to various factors such as tolerance or the like. In this case, movements of the diamond wheel in the Z-axis direction may not be appropriately controlled and thus even a front surface of the support substrate may also be ground. Therefore, the conventional edge trimming still has room for improvement.

Hereinafter, a substrate processing system and a substrate processing method according to the present exemplary embodiment for appropriately performing the edge trimming will be described with reference to the accompanying drawings. Further, in the present specification and drawings, components that have substantially the same function and structure are denoted with the same reference numeral, and repeated explanation is omitted.

First, a configuration of a substrate processing system according to an exemplary embodiment will be described. FIG. 1 is a schematic plan view illustrating a configuration of a substrate processing system 1.

Figure 2:
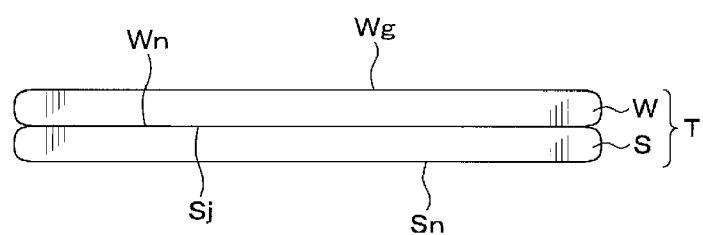
FIG. 2 is a schematic side view illustrating a configuration of a combined wafer.
Figure 3:
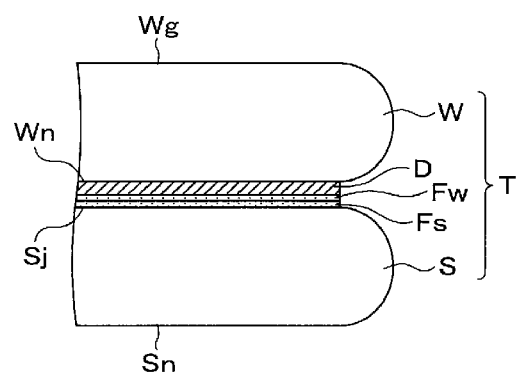
FIG. 3 is a schematic side view illustrating a configuration of a part of the combined wafer.

In the substrate processing system 1, a target wafer W as a first substrate is bonded to a support wafer S as a second substrate to form a combined wafer T as shown in FIG. 2 and FIG. 3 and then the target wafer W is thinned. Hereinafter, as for the target wafer W, a to-be-processed surface (a surface opposite to a surface bonded to the support wafer S) will be referred to as "processing surface Wg" and a surface opposite to the processing surface Wg will be referred to as "non-processing surface Wn". Also, as for the support wafer S, a surface to be bonded to the target wafer W will be referred to as "bonding surface Sj" and a surface opposite to the bonding surface Sj will be referred to as "non-bonding surface Sn".

The target wafer W is a semiconductor wafer such as a silicon wafer and a device layer D including a plurality of devices is formed on the non-processing surface Wn. Also, an oxide film Fw such as an $SiO_2$ film is formed on the device layer D. Further, a peripheral portion of the target wafer W is chamfered so that a cross section of the peripheral portion decreases in thickness toward a leading end thereof.

The support wafer S is configured to support the target wafer W. An oxide film Fs such as an $SiO_2$ film is formed on the bonding surface Sj of the support wafer S. Further, the support wafer S functions as a protection member configured to protect the non-processing surface Wn of the target wafer W. Furthermore, if a plurality of devices is formed on the bonding surface Sj of the support wafer S, a device layer (not shown) is formed on the bonding surface Sj as well as on the target wafer W.

FIG. 2 omits the illustration of the device layer D and the oxide films Fw and Fs for simplification of illustration. Also, in the other drawings to be referred to below, the illustration of the device layer D and the oxide films Fw and Fs may be omitted.

As shown in FIG. 1, the substrate processing system 1 includes a carry-in/out station 2 and a processing station 3 which are connected as one body. A cassette Ct configured to accommodate a plurality of combined wafers T is carried in/out between the carry-in/out station 2 and, for example, the outside. The processing station 3 includes various processing devices configured to perform predetermined processings on the combined wafer T.

In the carry-in/out station 2, a cassette mounting table 10 is provided. In the illustrated example, a plurality of, for example, four cassettes Ct can be arranged in a row in the Y-axis direction on the cassette mounting table 10. Further, the number of cassettes Ct arranged on the cassette mounting table 10 is not limited to the present exemplary embodiment, but can be arbitrarily determined.

In the carry-in/out station 2, a wafer transfer section 20 is provided adjacent to the cassette mounting table 10. The wafer transfer section 20 is equipped with a wafer transfer device 22 which is movable along a transfer path 21 elongated in the Y-axis direction. The wafer transfer device 22 is configured to hold and transfer the combined wafer T and has, for example, two transfer arms 23 and 23. Each transfer arm 23 is movable in the horizontal direction, in the vertical direction, around a horizontal axis and around a vertical axis. Also, the configuration of the transfer arm 23 is not limited to the present exemplary embodiment, but can be arbitrarily determined.

In the processing station 3, a wafer transfer section 30 is provided. The wafer transfer section 30 is equipped with a wafer transfer device 32 which is movable along a transfer path 31 elongated in an X-axis direction. The wafer transfer device 32 is configured to transfer the combined wafer T to a transition device 34, wet etching devices 40 and 41 and a processing device 50 which will be described below. Further, the wafer transfer device 32 has, for example, two transfer arms 33 and 33 each configured to hold and transfer the combined wafer T. Each transfer arm 33 is movable in the horizontal direction, in the vertical direction, around the horizontal axis and around the vertical axis. Also, the configuration of the transfer arm 33 is not limited to the present exemplary embodiment, but can be arbitrarily determined.

The transition device 34 for delivering the combined wafer T is provided between the wafer transfer section 20 and the wafer transfer section 30.

On the positive side of the Y-axis direction of the wafer transfer section 30, the wet etching devices 40 and 41 are arranged in this order from the carry-in/out station 2 in the X-axis direction. In the wet etching devices 40 and 41, wet etching is performed on the processing surface Wg of the target wafer W with a chemical solution such as hydrofluoric acid or the like.

On the positive side of the X-axis direction of the wafer transfer section 30, the processing device 50 is placed. In the processing device 50, processings such as grinding and cleaning are performed on the target wafer W.

The substrate processing system 1 described above is equipped with a control device 60. The control device 60 is, for example, a computer, and is provided with a program storage (not shown). The program storage stores a program that controls a processing of the combined wafer T in the substrate processing system 1. Also, the program storage stores a program for controlling operations of a driving unit such as the above-described processing devices and transfer devices to implement a substrate processing, which will be described below, in the substrate processing system 1. Further, the program is recorded in a computer-readable recording medium H and may be installed on the control device 60 from the recording medium H.

Hereinafter, the processing device 50 will be described. The processing device 50 includes a turntable 70, a transfer unit 80, a processing unit 90, a first cleaning unit 110, a second cleaning unit 120, a rough grinding unit 130, an intermediate grinding unit 140 and a finishing grinding unit 150.

The turntable 70 is configured to be rotated by a rotating mechanism (not shown). Four chucks 71 each configured to attract and hold the combined wafer T are provided on the turntable 70. The chucks 71 are equally spaced, i.e., located every 90 degrees, on a circle concentric with the turntable 70. The four chucks 71 can be moved to a delivery position A0 and processing positions A1 to A3 as the turntable 70 is rotated. Also, each of the four chucks 71 is configured to be pivotable around a vertical axis by a rotation mechanism (not shown).

In the present exemplary embodiment, the delivery position A0 refers to a position on the negative side of the X-axis direction and the negative side of the Y-axis direction of the turntable 70, and on the negative side of the X-axis direction of the delivery position A0, the second cleaning unit 120, the processing unit 90 and the first cleaning unit 110 are arranged. The processing unit 90 and the first cleaning unit 110 are stacked in this order from above. The first processing position A1 refers to a position on the positive side of the X-axis direction and the negative side of the Y-axis direction of the turntable 70, and the rough grinding unit 130 is placed at the first processing position A1. The second processing position A2 refers to a position on the positive side of the X-axis direction and the positive side of the Y-axis direction of the turntable 70, and the intermediate grinding unit 140 is placed at the second processing position A2. The third processing position A3 refers to a position on the negative side of the X-axis direction and the positive side of the Y-axis direction of the turntable 70, and the finishing grinding unit 150 is placed at the third processing position A3.

The transfer unit 80 is a multi-joint robot having a plurality of, for example, three arms 81. Each of the three arms 81 is configured to be pivotable. An arm 81 at a leading end is equipped with a transfer pad 82 that attracts and holds the combined wafer T. Also, an arm 81 at a base end is provided in a moving mechanism 83 configured to move the arm 81 in the vertical direction. Further, the transfer unit 80 having the configuration as described above may transfer the combined wafer T to the delivery position A0, the processing unit 90, the first cleaning unit 110 and the second cleaning unit 120.

In the processing unit 90, an orientation of the horizontal direction of the combined wafer T before being ground is adjusted. For example, while the combined wafer T held on a chuck 91 is rotated, a position of a notch of the target wafer W is detected by a detector (not shown) to adjust the position of the notch and thus to adjust the orientation of the horizontal direction of the combined wafer T.

Figure 4:
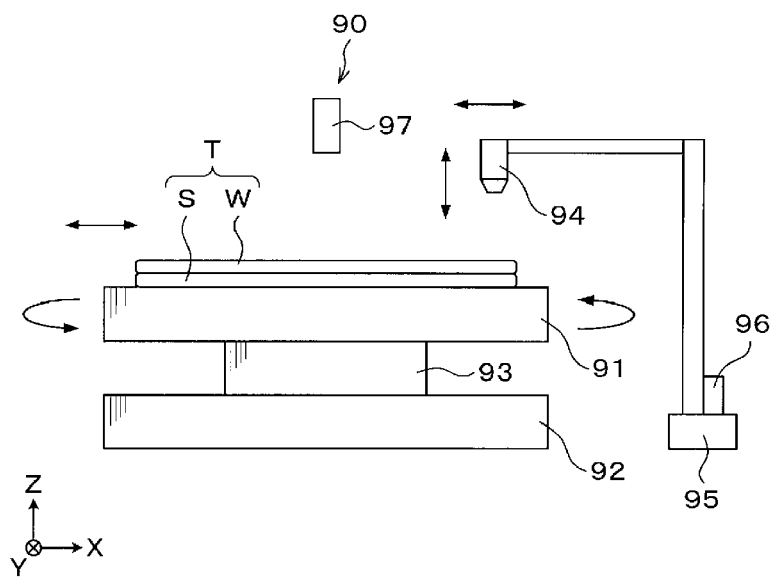
FIG. 4 is a schematic side view illustrating a configuration of a processing unit.

Further, in the processing unit 90, a laser beam is radiated into the target wafer W to form a modification layer. The processing unit 90 is equipped with the chuck 91, serving as a holder, that holds the combined wafer T in which the target wafer W is arranged on the upper side and the support wafer S is arranged on the lower side as shown in FIG. 4. The chuck 91 is configured to be movable in the X-axis direction and in the Y-axis direction by a moving mechanism 92. The moving mechanism 92 is configured as a general precise XY stage. Further, the chuck 91 is configured to be pivotable around a vertical axis by a rotation mechanism 93.

Figure 5:
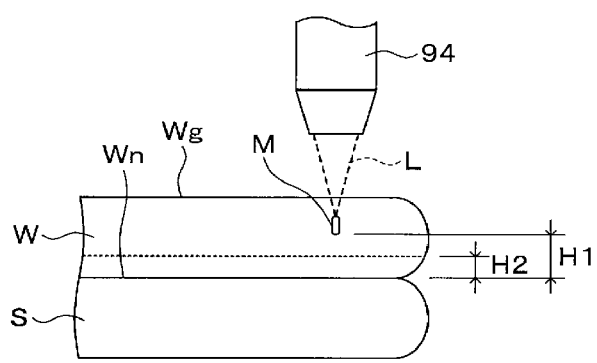
FIG. 5 is a longitudinal cross sectional view illustrating a modification layer formed in a target wafer.

A laser head 94 serving as a modifying unit configured to radiate a laser beam into the target wafer W is provided above the chuck 91. The laser head 94 focuses a high frequency pulsed laser oscillated from a laser beam oscillator (not shown), i.e., a laser beam having a wavelength transmissive to the target wafer W, to a predetermined position within the target wafer W. Thus, in the target wafer W, a portion where the laser beam is focused is modified to form a modification layer M as shown in FIG. 5. The modification layer M is elongated in a plate thickness direction and has a vertically long aspect ratio. The laser head 94 is configured to be movable in the X-axis direction and in the Y-axis direction by a moving mechanism 95 as shown in FIG. 4. Further, the laser head 94 is configured to be movable in the Z-axis direction by an elevation mechanism 96.

Further, in the processing unit 90, an eccentricity of the target wafer W in the combined wafer T is detected. In this case, an eccentricity detector 97 is provided above a central portion of the chuck 91. The eccentricity detector 97 is configured to be movable in the X-axis direction, in the Y-axis direction and in the Z-axis direction by a moving mechanism (not shown). The eccentricity detector 97 is equipped with, for example, a CCD camera. Further, the eccentricity detector 97 captures the image of the combined wafer T held on the chuck 91, for example, at least three points on an outer peripheral portion thereof. Then, a deviation of the center of the target wafer W with respect to the rotation center of the chuck 91, i.e., the eccentricity of the target wafer W in the combined wafer T is detected. Further, the configuration of the eccentricity detector 97 is not limited to the present exemplary embodiment, and the eccentricity detector 97 may further include, for example, an IR camera. In this case, the eccentricity detector 97 captures the image of, for example, an alignment mark formed on the target wafer W and detects the eccentricity of the target wafer W in the combined wafer T.

In the processing unit 90, the combined wafer T is held on the chuck 91. Then, the eccentricity detector 97 captures the image of the combined wafer T to detect the eccentricity of the target wafer W in the combined wafer T. The detection result by the eccentricity detector 97 is output to the control device 60. Herein, as described below, the modification layer M is formed while the chuck 91 is rotated, and, thus, a laser beam L from the laser head 94 is annularly radiated to the target wafer W. Here, if the target wafer W is eccentric, the laser beam L for the target wafer W becomes eccentric. Therefore, in the control device 60, the central axis of the chuck 91 is adjusted and the moving mechanism 92 is controlled in order for the laser beam L from the laser head 94 not to be eccentric. Further, the chuck 91 is moved in the horizontal direction by the moving mechanism 92 to adjust the position of the center of the target wafer W in the combined wafer T.

Also, while the position of the center of the target wafer W is adjusted, the laser head 94 is moved in the horizontal direction by the moving mechanism 95 to adjust the position of the laser head 94 to be located right above a predetermined position of the combined wafer T (the target wafer W). Then, while the chuck 91 is rotated by the rotation mechanism 93, the laser beam L is radiated into the target wafer W from the laser head 94 to form the annular modification layer M within the target wafer W as shown in FIG. 5.

Figure 6:
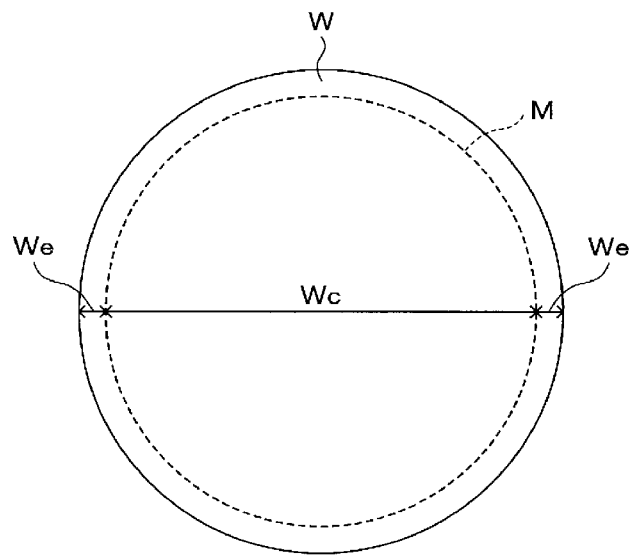
FIG. 6 is a plan view illustrating the modification layer formed in the target wafer.

The position of the modification layer M formed in the target wafer W will be described in detail. In the substrate processing system 1, the processing surface Wg of the target wafer W bonded to the support wafer S is ground, and the peripheral portion of the target wafer W is removed before being ground, in order to suppress the knife edge from being formed on the peripheral portion of the target wafer W after being ground. The modification layer M serves as a starting point of removing the peripheral portion and is annularly formed along a boundary between a central portion We and the peripheral portion We as a removing target in the target wafer W as shown in FIG. 6. Also, the peripheral portion We is in the range of, for example, 0.5 mm to 2.0 mm in a diametric direction from an edge of the target wafer W and includes the chamfered portion.

Further, as shown in FIG. 5, a lower end of the modification layer M is located above a target surface (indicated by a dotted line in FIG. 5) of the target wafer W after being ground. That is, a distance H1 between the lower end of the modification layer M and the non-processing surface Wn of the target wafer W is greater than a target thickness H2 of the target wafer W after being ground. The distance H1 is arbitrary and may be, for example, 5 µm to 10 µm greater than the target thickness H2. In this case, the modification layer M does not remain in the target wafer W after being ground.

Further, in the processing unit 90 according to the present exemplary embodiment, the chuck 91 is moved in the horizontal direction, but the laser head 94 may be moved in the horizontal direction, or both the chuck 91 and the laser head 94 may be moved in the horizontal direction. Furthermore, the chuck 91 is rotated, but the laser head 94 may be rotated.

In the first cleaning unit 110, the processing surface Wg of the target wafer W after being ground is cleaned and more specifically spin-cleaned as shown in FIG. 1. For example, while the combined wafer T held on a spin chuck (not shown) is rotated, a cleaning solution is supplied onto the processing surface Wg from a cleaning solution nozzle (not shown). Then, the supplied cleaning solution is spread on the processing surface Wg so that the processing surface Wg is cleaned.

In the second cleaning unit 120, the non-bonding surface Sn of the support wafer S is cleaned while the target wafer W after being ground is held on the transfer pad 82, and also the transfer pad 82 is cleaned.

Figure 7:
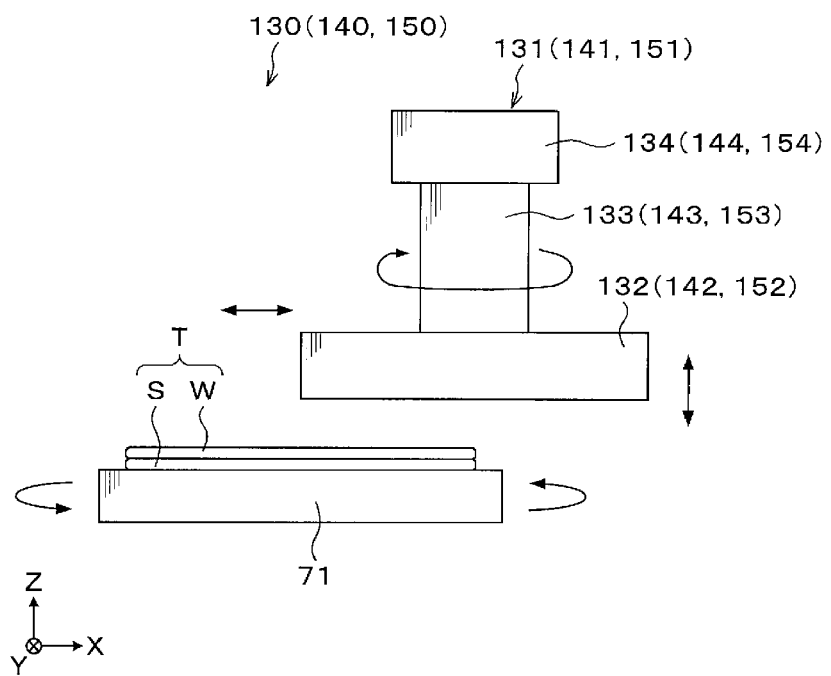
FIG. 7 is a schematic side view illustrating a configuration of each grinding unit.

In the rough grinding unit 130, rough grinding is performed on the processing surface Wg of the target wafer W. The rough grinding unit 130 has a rough grinder 131. The rough grinder 131 is equipped with a rough grinding whetstone 132, a spindle 133 and a driver 134 as shown in FIG. 7. The rough grinding whetstone 132 is annularly provided above the chuck 71. The rough grinding whetstone 132 is equipped with the driver 134 via the spindle 133. The driver 134 includes, for example, a motor (not shown) to rotate the rough grinding whetstone 132 and move the rough grinding whetstone 132 in the vertical direction and the horizontal direction along a column 135 shown in FIG. 1. Further, in the rough grinding unit 130, in a state where the target wafer W held on the chuck 71 is in contact with a part of a circular arc of the rough grinding whetstone 132, each of the chuck 71 and the rough grinding whetstone 132 is rotated to grind the processing surface Wg of the target wafer W.

In the intermediate grinding unit 140, intermediate grinding is performed on the processing surface Wg of the target wafer W. The intermediate grinding unit 140 has substantially the same configuration as the rough grinding unit 130, as shown in FIG. 1 and FIG. 7 and is equipped with an intermediate grinder 141, an intermediate grinding whetstone 142, a spindle 143, a driver 144 and a column 145. Further, a particle size of abrasive grains of the intermediate grinding whetstone 142 is smaller than a particle size of abrasive grains of the rough grinding whetstone 132.

In the finishing grinding unit 150, finishing grinding is performed on the processing surface Wg of the target wafer W. The finishing grinding unit 150 has substantially the same configuration as the intermediate grinding unit 140, as shown in FIG. 1 and FIG. 7 and is equipped with a finishing grinder 151, a finishing grinding whetstone 152, a spindle 153, a driver 154 and a column 155. Further, a particle size of abrasive grains of the finishing grinding whetstone 152 is smaller than the particle size of abrasive grains of the intermediate grinding whetstone 142.

Further, in the present exemplary embodiment, the processing unit 90 is equipped with the laser head 94 serving as the modifying unit, and the processing device 50 is configured as a modification layer forming device. Furthermore, in the present exemplary embodiment, the processing unit 90 is equipped with the eccentricity detector 97, and the processing device 50 is configured an eccentric detection device. Moreover, in the present exemplary embodiment, as described below, the peripheral portion We of the target wafer W is removed by the rough grinding unit 130 (or the rough grinding unit 130 and the intermediate grinding unit 140), and the processing device 50 is configured as a periphery removing device.

Hereinafter, wafer processings to be performed by the substrate processing system 1 configured as described above will be described. In the present exemplary embodiment, the combined wafer T is formed in advance by bonding the target wafer W and the support wafer S by van der Waals forces and hydrogen bond (intermolecular force) in a bonding device (not shown) outside the substrate processing system 1.

First, the cassette Ct that accommodates a plurality of combined wafers T is placed on the cassette mounting table 10 of the carry-in/out station 2.

Then, a combined wafer T is taken out of the cassette Ct and transferred into the transition device 34 by the wafer transfer device 22. Thereafter, the combined wafer T is taken out of the transition device 34 and transferred into the processing device 50 by the wafer transfer device 32.

The combined wafer T transferred into the processing device 50 is delivered to the processing unit 90. In the processing unit 90, the combined wafer T is delivered onto the chuck 91 by the wafer transfer device 32 and held on the chuck 91. Then, the orientation of the horizontal direction of the target wafer W is adjusted by the detector (not shown).

Further, in the processing unit 90, the eccentricity detector 97 captures the image of the combined wafer T to detect the eccentricity of the target wafer W in the combined wafer T held on the chuck 91. The detection result by the eccentricity detector 97 is output to the control device 60. In the control device 60, the central axis of the chuck 91 is adjusted based on the detection result by the eccentricity detector 97, i.e., the eccentricity of the target wafer W. Specifically, when the modification layer M is formed in a subsequent process, the central axis of the chuck 91 is adjusted in order for the laser L from the laser head 94 not to be eccentric with respect to the target wafer W. Also, the chuck 91 is moved in the horizontal direction by the moving mechanism 92 under the control of the control device 60. Accordingly, the position of the center of the target wafer W in the combined wafer T can be adjusted. Further, if the eccentricity detector 97 determines that the target wafer W is not eccentric, the central axis of the chuck 91 does not need to be moved.

Figure 8A:
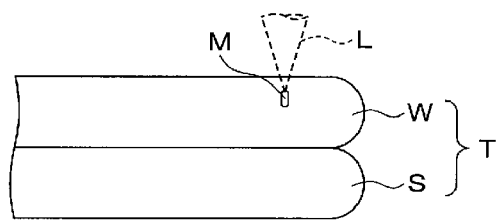
FIG. 8A to FIG. 8C are explanatory diagrams showing the target wafer in main processes of wafer processing according to the present exemplary embodiment.

Further, while the position of the center of the target wafer W is adjusted, the laser head 94 is moved in the horizontal direction by the moving mechanism 95 to adjust the position of the laser head 94 to be located right above a predetermined position of the combined wafer T (the target wafer W). The predetermined position refers to the boundary between the peripheral portion We and the central portion Wc of the target wafer W. Then, while the chuck 91 is rotated by the rotation mechanism 93, the laser beam L is radiated into the target wafer W from the laser head 94 to form the annular modification layer M within the target wafer W as shown in FIG. 8A. Here, the position of the center of the target wafer W is adjusted as described above, and, thus, the laser beam L is not eccentric with respect to the target wafer W and the modification layer M can be formed at an appropriate position. Also, the position of the target wafer W is as described above with reference to FIG. 5 and FIG. 6.

Figure 8B:
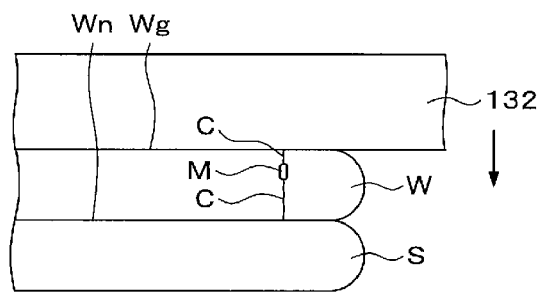

Then, the combined wafer T is transferred from the processing unit 90 to the delivery position A0 and then delivered onto the chuck 71 at the delivery position A0 by the transfer unit 80. Thereafter, the chuck 71 is moved to the first processing position A1. Subsequently, the rough grinding is performed on the processing surface Wg of the target wafer W by the rough grinding unit 130 as shown in FIG. 8B. Specifically, in a state where the target wafer W is in contact with a part of a circular arc of the rough grinding whetstone 132, the rough grinding whetstone 132 is lowered and each of the chuck 71 and the rough grinding whetstone 132 is rotated to grind the processing surface Wg of the target wafer W.

When the processing surface Wg is ground, the crack C within the target wafer W extends from the modification layer M in the plate thickness direction and reaches the processing surface Wg and the non-processing surface Wn. The crack C extends approximately linearly since the target wafer W is formed of single crystalline silicon. Also, the crack C is annularly formed when viewed from the top. The crack C may also extend when the modification layer M is formed by the processing unit 90. In other words, the crack C may be generated when the processing surface Wg is ground by the rough grinding unit 130 or when the modification layer M is formed by the processing unit 90.

Figure 8C:
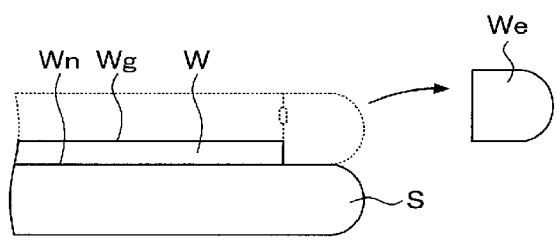

Further, as the grinding of the processing surface Wg progresses, the peripheral portion We of the target wafer W is peeled off to be removed starting from the modification layer M and the crack C as shown in FIG. 8C. Here, the crack C extends approximately linearly as described above, and, thus, the outer surface of the target wafer W after being removed can be smooth with less irregularities. Also, the lower end of the modification layer M is located above the target surface of the target wafer W after being ground as described above, and, thus, the modification layer M is removed when the processing surface Wg is ground. The modification layer M is amorphous and thus has low strength. Accordingly, in the present exemplary embodiment, the modification layer M does not remain in the target wafer W after being ground, and, thus, high strength can be secured.

Then, the chuck 71 is moved to the second processing position A2. Thereafter, the intermediate grinding is performed on the processing surface Wg of the target wafer W by the intermediate grinding unit 140. Further, if the peripheral portion We cannot be completely removed by the rough grinding unit 130, the peripheral portion We is completely removed by the intermediate grinding unit 140. That is, the peripheral portion We may be removed in two stages by the rough grinding unit 130 and the intermediate grinding unit 140. In this case, the size of the peripheral portion We to be removed may decrease in stages. That is, the size of the peripheral portion We to be removed by each of the grinding units 130 and 140 decreases.

Thereafter, the chuck 71 is moved to the third processing position A3. Then, the finishing grinding is performed on the processing surface Wg of the target wafer W by the finishing grinding unit 150.

Subsequently, the chuck 71 is moved to the delivery position A0. Here, the processing surface Wg of the target wafer W is roughly cleaned with the cleaning solution through the cleaning solution nozzle (not shown). Here, the processing surface Wg is cleaned to remove contaminants to some extent.

Then, the combined wafer T is transferred by the transfer unit 80 from the delivery position A0 to the second cleaning unit 120. Thereafter, in the second cleaning unit 120, while the target wafer W is held on the transfer pad 82, the non-bonding surface Sn of the support wafer S is cleaned and dried.

Thereafter, the combined wafer T is transferred by the transfer unit 80 from the second cleaning unit 120 to the first cleaning unit 110. Then, in the first cleaning unit 110, the processing surface Wg of the target wafer W is finally cleaned with the cleaning solution through the cleaning solution nozzle (not shown). Here, the processing surface Wg is cleaned to a required degree of cleanness and dried.

Then, the combined wafer T is sequentially transferred by the wafer transfer device 32 to the wet etching devices 40 and 41, and the processing surface Wg is wet-etched in two stages.

Subsequently, the combined wafer T after being subjected to all the required processings is transferred back into the transition device 34 by the wafer transfer device 32, and then, transferred into the cassette Ct on the cassette mounting table 10 by the wafer transfer device 22. Thus, a series of wafer processings in the substrate processing system 1 is ended.

According to the above-described exemplary embodiment, the following effects can be obtained. The following description is provided by comparison with the conventional method to grind and remove the peripheral portion of the target wafer by the wheel (grinding tool). Also, conventionally, there has been a method to remove the peripheral portion of the target wafer with a blade (grinding tool). This method has the same problem as in the method with the wheel.

If the target wafer and the support wafer are bonded to each other and then, the peripheral portion of the target wafer is ground and removed by the wheel as described in Patent Document 1, the vertical movements of the wheel may not be appropriately controlled due to various factors such as tolerance or the like, which may cause grinding of even the support wafer.

In this regard, in the present exemplary embodiment, the modification layer M is formed within the target wafer W, and, thus, the peripheral portion We can be removed starting from the modification layer M and the crack C. In this case, the bonding surface Sj of the support wafer S is not damaged by the grinding or the like.

Before the target wafer and the support wafer are bonded to each other, if the peripheral portion of the target wafer is ground to be removed with the wheel as in the conventional method, particles are generated by the grinding and may be bonded to devices of the target wafer.

In this regard, in the present exemplary embodiment, the peripheral portion We is peeled off to be removed starting from the modification layer M and crack C formed within the target wafer W, and, thus, particles are not generated.

If the wheel is used as in the conventional method, there is a limitation in adjusting the position of the wheel in the horizontal direction, which results in a non-uniformity of several μm. Thus, the non-uniformity causes a non-uniformity in width (trim width) of the peripheral portion to be ground and removed by the wheel, and, thus, processing accuracy deteriorates.

In this regard, in the present exemplary embodiment, the modification layer M is formed within the target wafer W with the laser beam, and, thus, high accuracy with an error of, for example, less than 1 μm can be secured. For this reason, the accuracy in width (trim width) of the peripheral portion We to be removed starting from the modification layer M can be improved.

If the wheel is used as in the conventional method, the wheel is lowered to grind the peripheral portion. Therefore, there is a limitation in the rotation speed of the chuck that holds the target wafer, and, thus, it takes time to remove the peripheral portion.

In this regard, in the present exemplary embodiment, the modification layer M is formed within the target wafer W with the high frequency laser beam. Therefore, the rotation speed of the chuck 91 can be increased, and, thus, the processings can be performed in a very short time. Accordingly, the throughput of the wafer processing can be improved.

If the wheel is used as in the conventional method, the wheel is worn away and thus needs to be regularly replaced. Also, when the grinding is performed using the wheel, grinding water is used, and, thus, waste water thereof needs to be treated. For this reason, running cost is required.

In this regard, in the present exemplary embodiment, the laser head 94 is not degraded with time, and, thus, the cycle of the maintenance can be reduced. Also, the processings are performed as dry processes with the laser beam, and, thus, the grinding water and the waste water do not need to be treated. For this reason, the running cost can be reduced.

Further, the notch for indicating the direction of crystal orientation is formed in the target wafer W which is the semiconductor wafer. However, when the peripheral portion We is removed with the blade only as in the conventional method, it is difficult to leave the shape of the notch as it is.

In this regard, in the present exemplary embodiment, for example, the processing unit 90 can control the operation of the target wafer W relative to the laser beam, and, thus, the modification layer M can be formed corresponding to the shape of the notch. Therefore, the peripheral portion We can be easily removed while leaving the shape of the notch.

Further, according to the present exemplary embodiment, in the processing unit 90, the eccentricity of the target wafer W in the combined wafer T is detected by the eccentricity detector 97. Then, the central axis of the chuck 91 is adjusted and the position of the center of the target wafer W in the combined wafer T is adjusted to remove the eccentricity of the target wafer W based on the detection result. Thus, thereafter, the laser beam L radiated from the laser head 94 into the target wafer W is not eccentric. Therefore, the annular modification layer M can be formed at an appropriate position within the target wafer W.

Furthermore, in the present exemplary embodiment, the central axis of the chuck 91 is adjusted based on the detection result by the eccentricity detector 97 (the eccentricity of the target wafer W), but the irradiation axis of the laser beam L from the laser head 94 may also be adjusted. Specifically, the laser head 94 may be moved in the horizontal direction by the moving mechanism 95 to adjust the irradiation axis of the laser beam L from the laser head 94. Even in this case, it is possible to suppress the eccentricity of the laser beam L radiated from the laser head 94 into the target wafer W. Therefore, the annular modification layer M can be formed at an appropriate position within the target wafer W.

Moreover, in the present exemplary embodiment, the eccentricity detector 97 is provided in the processing unit 90, but may be provided outside the processing device 50. For example, an eccentricity detection device (not shown) equipped with the chuck 91, the moving mechanism 92, the rotation mechanism 93 and the eccentricity detector 97 may be provided at a certain position in the processing station 3 of the substrate processing system 1.

In this case, the eccentricity detection device (the eccentricity detector 97) detects the eccentricity of the target wafer W in the combined wafer TI. The detection result by the eccentricity detection device is output to the control device 60. In the control device 60, the wafer transfer device 32 is controlled based on the detection result by the eccentricity detection device. Specifically, when the combined wafer T is transferred from the eccentricity detection device into the processing unit 90 by the wafer transfer device 32, the combined wafer T is transferred to match the center of the target wafer W with the center of the chuck 91. Thus, thereafter, the laser beam L radiated from the laser head 94 into the target wafer W is not eccentric. Therefore, the annular modification layer M can be formed at an appropriate position within the target wafer W.

Further, in the above-described exemplary embodiment, a method of efficiently removing the peripheral portion We when the processing surface Wg is ground is as follows. For example, the rough grinding whetstone 132 may be rotated, for example, in a direction from the outside of the target wafer W to the inside of the target wafer W being rotated. Otherwise, the rough grinding whetstone 132 may be rotated, for example, in a direction from the inside of the target wafer W to the outside of the target wafer W being rotated. As such, the rotation direction of the rough grinding whetstone 132 may be changed depending on the type of the target wafer W or processing.

Furthermore, when the processing surface Wg is ground, high pressure water may be jetted to the peripheral portion We from the inside toward the outside of the target wafer W to efficiently remove (blow away) the peripheral portion We.

In the above-described exemplary embodiment, there has been described a case where a single sheet of the target wafer W is bonded in the support wafer S, but semiconductor wafers on which devices are formed may be bonded to each other or a plurality of target wafers W on which devices are formed may be stacked. Hereinafter, there will be described a case where a plurality of target wafers W on which devices are formed is stacked by the substrate processing system 1 according to the present exemplary embodiment.

Figure 9A:
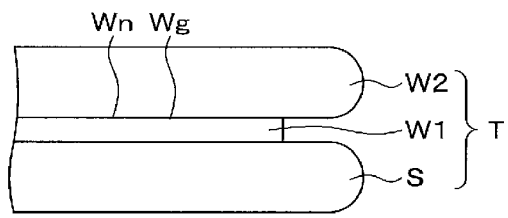
FIG. 9A to FIG. 9D are explanatory diagrams showing the target wafer in main processes of wafer processing according to another exemplary embodiment.

In the combined wafer T after being subjected to the wafer processing according to the exemplary embodiment, the peripheral portion We of the target wafer W is removed and the processing surface Wg is ground to a target thickness as shown in FIG. 9A. In the following description, a first sheet of a target wafer W will be referred to as "first target wafer W1".

As for this combined wafer T, the target wafer W are stacked and bonded to each other as shown in FIG. 9A in the bonding device (not shown) outside the substrate processing system 1. In the following description, a second sheet of a target wafer W will be referred to as "second target wafer W2". Further, the processing surface Wg of the first target wafer W1 is bonded to the non-processing surface Wn of the second target wafer W2 to form the combined wafer T.

Then, the combined wafer T in which the second target wafer W2 is bonded is transferred to the substrate processing system 1 while being accommodated in the cassette Ct. In the substrate processing system 1, the combined wafer T is transferred into the processing unit 90 of the processing device 50 by the wafer transfer device 32. In the processing unit 90, the combined wafer T is delivered onto the chuck and held thereon and then, the orientation of the horizontal direction of the second target wafer W2 is adjusted by the detector (not shown).

Figure 9B:
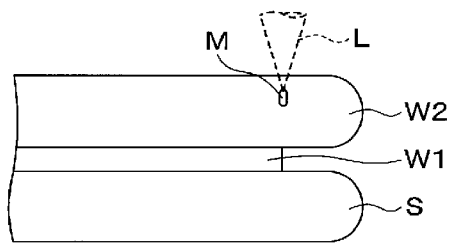

Further, in the processing unit 90, the eccentricity detector 97 captures the image of the combined wafer T to detect the eccentricity of the second target wafer W2 in the combined wafer T. The central axis of the chuck 91 is adjusted based on the detection result of the eccentricity of the second target wafer W2, and, thus, the center of the second target wafer W2 in the combined wafer T can be adjusted. Otherwise, the irradiation axis of the laser beam L from the laser head 94 may be adjusted based on the detection result of the eccentricity of the second target wafer W2. Then, the laser head 94 is moved to above the peripheral portion We. Thereafter, while the chuck 91 is rotated, the laser beam L is radiated into the second target wafer W2 from the laser head 94. Thus, as shown in FIG. 9B, the modification layer M is formed at a predetermined position within the second target wafer W2.

Figure 9C:
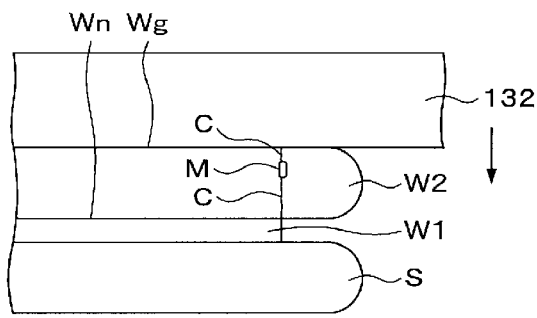
Figure 9D:
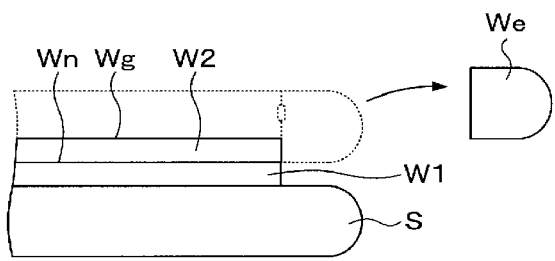

Then, the combined wafer T is transferred onto the chuck 71 at the delivery position A0 by the transfer unit 80, and then, the chuck 71 is moved to the first processing position A1. Thereafter, in the rough grinding unit 130, the processing surface Wg of the second target wafer W2 is ground by the rough grinding whetstone 132 as shown in FIG. 9C. Here, as shown in FIG. 9D, the peripheral portion We is removed starting from the modification layer M and the crack C.

Thereafter, the chuck 71 is moved to the second processing position A2. Subsequently, the intermediate grinding is performed on the processing surface Wg of the second target wafer W2 by the intermediate grinding unit 140. Further, if the peripheral portion We cannot be completely removed by the rough grinding unit 130, the peripheral portion We is completely removed by the intermediate grinding unit 140.

Thereafter, the chuck 71 is moved to the third processing position A3. Then, the finishing grinding is performed on the processing surface Wg of the second target wafer W2 by the finishing grinding unit 150.

The subsequent processings to be performed on the second target wafer W2 are the same as those in the above-described exemplary embodiment. That is, the cleaning of the non-bonding surface Sn in the second cleaning unit 120, the cleaning of the processing surface Wg in the first cleaning unit 110 and the wet etching of the processing surface Wg in the wet etching devices 40 and 41 are performed. Thus, a series of wafer processings in the substrate processing system 1 is ended.

In the combined wafer T shown in FIG. 9A, when the peripheral portion We of the second target wafer W2 is removed with the wheel as in the conventional method, the non-processing surface Wn of the second target wafer W2 is hollow thereunder, and, thus, it is difficult to grind the peripheral portion We.

In this regard, in the present exemplary embodiment, the modification layer M is formed within the second target wafer W2, and, thus, the peripheral portion We can be easily removed starting from the modification layer M and the crack C.

Further, if the wheel and the blade are used as in the conventional method, there is a limitation in adjusting the position of the wheel and the blade in the horizontal direction, which results in a non-uniformity of several μm. Thus, the non-uniformity causes a non-uniformity in width (trim width) of the peripheral portion to be ground and removed by the wheel and the blade. Particularly, as the target wafers are stacked, the non-uniformity increases. Therefore, for example, the target wafer as the upper layer may be protruded from the target wafer as the lower layer.

In this regard, in the present exemplary embodiment, the modification layer M is formed within the second target wafer W2 with the laser beam, and, thus, high accuracy can be secured. Therefore, the second target wafer W2 can be appropriately stacked.

Figure 10A:
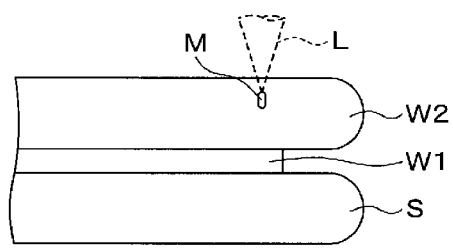
FIG. 10A and FIG. 10B are explanatory diagrams showing the target wafer in main processes of wafer processing according to another exemplary embodiment.
Figure 10B:
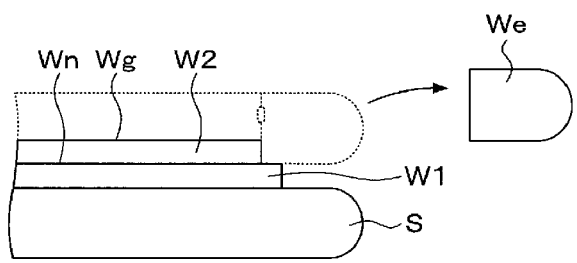

Further, if a plurality of target wafers W is stacked as in the present exemplary embodiment, the peripheral portion We to be removed from the second target wafer W2 as an upper layer may be located more inwards than the peripheral portion We to be removed from the first target wafer W1 as a lower layer. That is, as shown in FIG. 10A, the modification layer M within the second target wafer W2 may be formed more inwards in a diametric direction than an end of the first target wafer W1. In this case, the diameter of the second target wafer W2 which is stacked last is smaller than the diameter of the first target wafer W1 as shown in FIG. 10B. Thus, it is possible to reliably suppress the second target wafer W2 from being protruded from the first target wafer W1.

In the above-described exemplary embodiment, a method of efficiently removing the peripheral portion We includes reducing bonding force between an interface between the target wafer W corresponding to the peripheral portion We to be removed and the support wafer S. Examples of the method of reducing the bonding force may include the following method.

For example, a laser beam is radiated even to the non-processing surface Wn of the target wafer W to cause ablation on each interface. Specifically, for example, the processing unit 90 shown in FIG. 11 further includes a laser head 200 serving as an interface processing unit, a moving mechanism 201 and an elevation mechanism 202 in addition to the configuration of the processing unit 90 shown in FIG. 4.

The laser head 200 radiates the laser beam to the non-processing surface Wn to modify the non-processing surface Wn. The laser head 200 focuses a high frequency pulse-shaped laser oscillated from a laser beam oscillator (not shown), i.e., a laser beam having a wavelength transmissive to the target wafer W, to a predetermined position within the target wafer W. Thus, in the target wafer W, a portion where the laser beam is focused is modified. The moving mechanism 201 moves the laser head 200 in the X-axis direction and in the Y-axis direction. The moving mechanism 201 is configured as a general precise XY stage. Further, the elevation mechanism 202 moves the laser head 200 in the Z-axis direction. In the present exemplary embodiment, the processing unit 90 has the laser head 200 serving as a modifying unit, and the processing device 50 is configured as an interface processing device.

In the processing unit 90, when the interface between the target wafer W and the support wafer S is processed, the inside of the target wafer W is modified or the inside of the device layer D is modified. That is, in the present exemplary embodiment, the interface includes the inside of the target wafer W and the inside of the device layer D.

Figure 12:
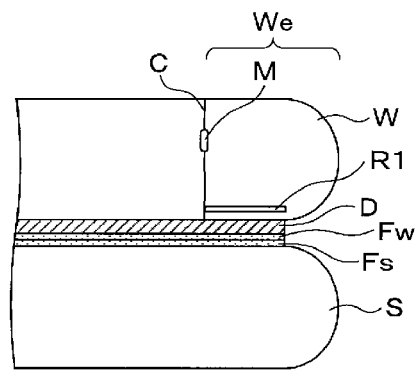
FIG. 12 is a longitudinal cross sectional view illustrating a modification surface formed within the target wafer according to another exemplary embodiment.
Figure 13:
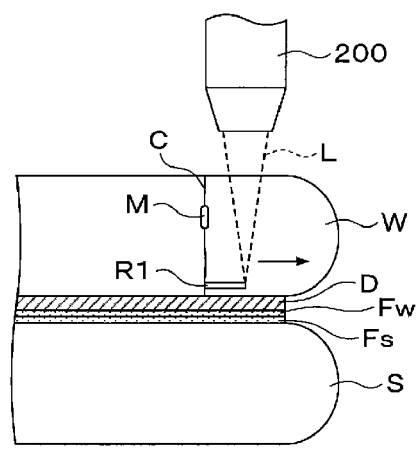
FIG. 13 is an explanatory diagram for the longitudinal cross sectional view showing a state where the modification surface shown in FIG. 12 is formed.

As shown in FIG. 12, if the inside of the target wafer W is modified, a modification surface R1 is formed near the non-processing surface Wn in the peripheral portion We (outside the modification layer M). In this processing method, the laser beam L is radiated toward the inside of the target wafer W from the laser head 200 as shown in FIG. 13. The laser beam L is focused passing through the inside of the target wafer W and a portion where the laser beam L is focused is modified. Then, while the chuck 91 is rotated by the rotation mechanism 93, the laser head 200 is moved outwards in the diametric direction by the moving mechanism 201, the laser beam L is radiated within the target wafer W from the laser head 200. As a result, the modification surface R1 is formed. Otherwise, when the modification surface R1 is formed, the chuck 91 may be moved in the diametric direction by the moving mechanism 92, or both the laser head 200 and the chuck 91 may be moved.

Further, if the modification surface R1 is formed within the target wafer W as such, after the peripheral portion We is removed, a part of the target wafer W remains on the support wafer S. For this reason, after the peripheral portion We is removed, the remaining part of the target wafer W may be removed by etching.

Figure 14:
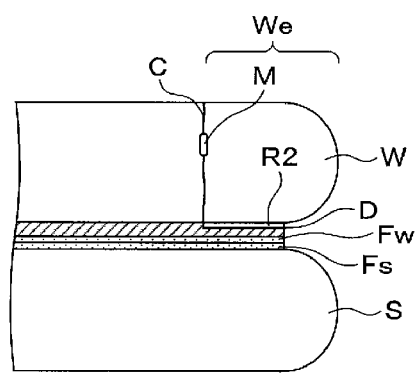
FIG. 14 is a longitudinal cross sectional view illustrating the modification surface formed on a device layer of the target wafer according to another exemplary embodiment.

As shown in FIG. 14, if the inside of the device layer D is modified, a modification surface R2 is formed within the device layer D in the peripheral portion We (outside the modification layer M). This processing method may include, for example, three methods as shown in FIG. 15A to FIG. 15C.

Figure 15A:
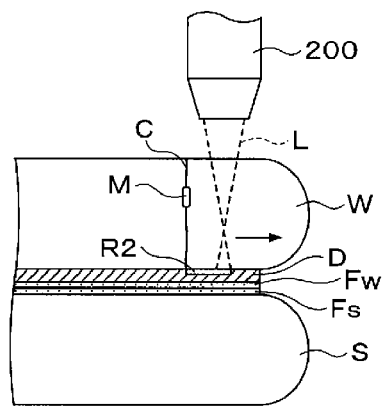
FIG. 15A to FIG. 15C are explanatory diagrams for the longitudinal cross sectional view showing a state where the modification surface shown in FIG. 14 is formed.

A first processing method is a method of locating a focusing point of the laser beam L from the laser head 200 above the device layer D within the target wafer W as shown in FIG. 15A. In this case, energy of the laser beam L is set to be small enough for the target wafer W not to be modified even when the laser beam L is focused. Then, the laser beam L is focused first within the target wafer W and the laser beam L which is defocused and spread passes through the target wafer W to be radiated to the device layer D. The laser beam L is absorbed into the device layer D, and the device layer D causes ablation. Further, while the chuck 91 is rotated by the rotation mechanism 93 and the laser head 200 is moved outwards in the diametric direction by the moving mechanism 201, the laser beam L is radiated from the laser head 200. As a result, the modification surface R2 is formed. Otherwise, when the modification surface R2 is formed, the chuck 91 may be moved in the diametric direction by the moving mechanism 92, or both the laser head 200 and the chuck 91 may be moved.

Figure 15B:
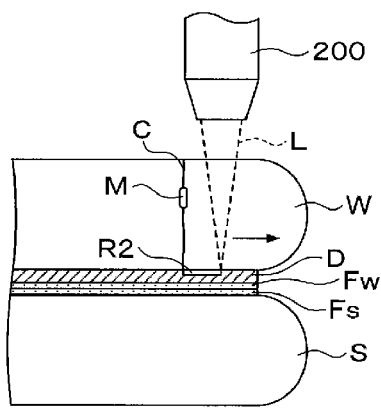

A second processing method is a method of locating the focusing point of the laser beam L from the laser head 200 within the device layer D as shown in FIG. 15B. In this case, the laser beam L passes through the target wafer W to be radiated to the device layer D, and the device layer D causes the ablation. Further, while the chuck 91 is rotated by the rotation mechanism 93 and the laser head 200 is moved outwards in the diametric direction by the moving mechanism 201, the laser beam L is radiated from the laser head 200. As a result, the modification surface R2 is formed. Otherwise, when the modification surface R2 is formed, the chuck 91 may be moved in the diametric direction by the moving mechanism 92, or both the laser head 200 and the chuck 91 may be moved.

Figure 15C:
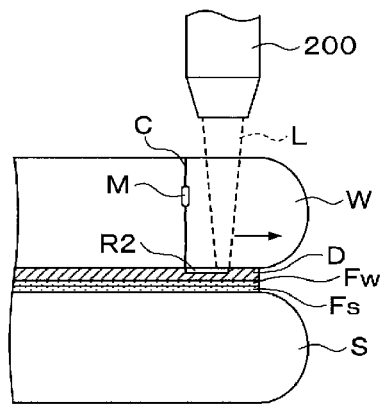

A third processing method is a method of locating the focusing point of the laser beam L from the laser head 200 below the device layer D as shown in FIG. 15C. In this case, the laser beam L passes through the target wafer W to be radiated to the device layer D, and the device layer D causes the ablation. Also, the laser beam L is absorbed in the device layer D and thus is not focused below the device layer D. Further, while the chuck 91 is rotated by the rotation mechanism 93 and the laser head 200 is moved outwards in the diametric direction by the moving mechanism 201, the laser beam L is radiated from the laser head 200. Then, the modification surface R2 is formed in the device layer D. Otherwise, when the modification surface R2 is formed, the chuck 91 may be moved in the diametric direction by the moving mechanism 92, or both the laser head 200 and the chuck 91 may be moved.

As described above, the modification surface R1 or R2 is formed while the chuck 91 is rotated, and, thus, the laser beam L from the laser head 200 is annularly radiated to the target wafer W. Here, if the target wafer W is eccentric, the laser beam L for the target wafer W becomes eccentric. Therefore, before the modification surface R1 or R2 is formed, the eccentricity detector 97 captures the image of the combined wafer T to detect the eccentricity of the target wafer W in the combined wafer T. The detection result by the eccentricity detector 97 is output to the control device 60. Further, in the control device 60, the central axis of the chuck 91 or the irradiation axis of the laser beam L from the laser head 200 is adjusted based on the detection result by the eccentricity detector 97. If the central axis of the chuck 91 is adjusted, the chuck 91 is moved in the horizontal direction by the moving mechanism 92 to adjust the position of the center of the target wafer W in the combined wafer T. If the irradiation axis of the laser beam L from the laser head 200 is adjusted, the laser head 94 is moved in the horizontal direction by the moving mechanism 201. In either case, it is possible to suppress the eccentricity of the laser beam L radiated from the laser head 200 to the target wafer W. Therefore, the annular modification surface R1 or R2 can be formed at an appropriate position in the target wafer W.

Hereinafter, wafer processings to be performed by the substrate processing system 1 configured as described above will be described. In the present exemplary embodiment, detailed description of the same processings as those in the above described exemplary embodiment will be omitted.

First, the combined wafer T is transferred into the processing unit 90 of the processing device 50 by the wafer transfer device 32. In the processing unit 90, the combined wafer T is delivered to be held onto the chuck 91. Then, the orientation of the horizontal direction of the target wafer W is adjusted by the detector (not shown).

Further, in the processing unit 90, the eccentricity detector 97 captures the image of the combined wafer T to detect the eccentricity of the target wafer W in the combined wafer T. The central axis of the chuck 91, the irradiation axis of the laser beam L from the laser head 94 or the irradiation axis of the laser beam L from the laser head 200 is adjusted based on the detection result of the eccentricity of the target wafer W.

Figure 16A:
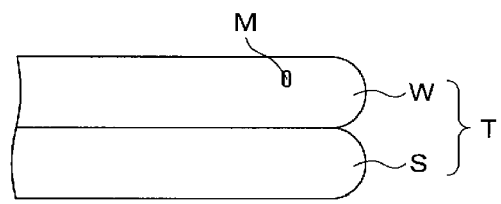
FIG. 16A to FIG. 16D are explanatory diagrams showing the target wafer in main processes of wafer processing according to another exemplary embodiment.

Then, the laser head 94 is moved to above the peripheral portion We. Thereafter, while the chuck 91 is rotated, the laser beam L is radiated from the laser head 94 into the target wafer W to form the modification layer M at a predetermined position within the target wafer W as shown in FIG. 16A. Here, if the central axis of the chuck 91 or the irradiation axis of the laser beam L from the laser head 94 is adjusted, the modification layer M can be appropriately formed.

Figure 16B:
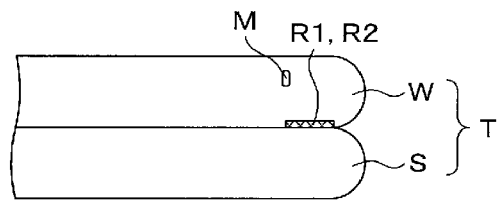

Then, in the processing unit 90, the laser head 94 is retreated and the laser head 200 is moved to above the peripheral portion We. Further, while the chuck 91 is rotated and the laser head 200 is moved outwards in the diametric direction, the laser beam is radiated from the laser head 200. Thus, as shown in FIG. 16B, the modification surface R1 or R2 is formed within the target wafer W or in the device layer D, respectively. Here, if the central axis of the chuck 91 or the irradiation axis of the laser beam L from the laser head 200 is adjusted, the modification surface R1 or R2 can be appropriately formed.

Further, the forming of the modification layer M shown in FIG. 16A and the forming of the modification surface R1 or R2 shown in FIG. 16B may be performed in reverse order.

Figure 16C:
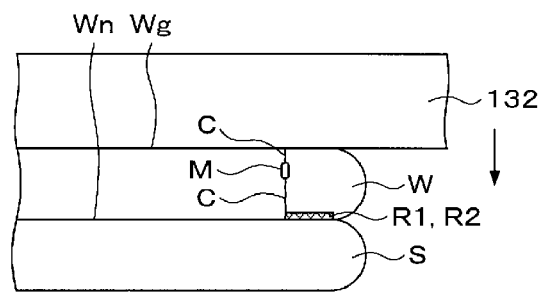
Figure 16D:
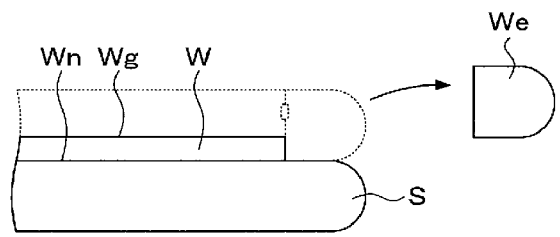

Then, the combined wafer T is delivered onto the chuck 71 at the delivery position A0 by the transfer unit 80. Thereafter, the chuck 71 is moved to the first processing position A1. Subsequently, in the rough grinding unit 130, the processing surface Wg of the target wafer W is ground by the rough grinding whetstone 132 as shown in FIG. 16C. Thus, the peripheral portion We is peeled off to be removed starting from the modification layer M and the crack C as shown in FIG. 16D. Here, since the modification surface R1 or R2 is formed on the interface between the target wafer W and the support wafer S, the bonding force is reduced. Therefore, the peripheral portion We can be appropriately removed.

Subsequently, the chuck 71 is moved to the second processing position A2. Then, the intermediate grinding is performed on the processing surface Wg of the target wafer W by the intermediate grinding unit 140. Further, if the peripheral portion We cannot be completely removed by the rough grinding unit 130, the peripheral portion We is completely removed by the intermediate grinding unit 140.

Then, the chuck 71 is moved to the third processing position A3. Thereafter, the finishing grinding is performed on the processing surface of the target wafer W by the finishing grinding unit 150.

The subsequent processings to be performed on the target wafer W are the same as those in the above-described exemplary embodiment. That is, the cleaning of the non-bonding surface Sn in the second cleaning unit 120, the cleaning of the processing surface Wg in the first cleaning unit 110 and the wet etching of the processing surface Wg in the wet etching devices 40 and 41 are performed. Thus, a series of wafer processings in the substrate processing system 1 is ended.

The present exemplary embodiment can also obtain the same effects as the above-described exemplary embodiment. Further, the central axis of the chuck 91, the irradiation axis of the laser beam L from the laser head 94 or the irradiation axis of the laser beam L from the laser head 200 is adjusted based on the detection result of the eccentricity of the target wafer W by the eccentricity detector 97. For this reason, the modification layer M and the modification surface R1 or R2 can be appropriately formed. Further, in the processing unit 90, the modification layer M and the modification surface R1 or R2 are formed using the same chuck 91, and, thus, the target wafer W is not eccentric in the processing by the laser head 94 and the processing by the laser head 200. As a result, the position of the modification layer M can be matched with the inner peripheral position of the modification surface R1 or R2, and, thus, the peripheral portion We can be more appropriately removed.

Here, for example, if the bonding force in the peripheral portion We is reduced before the target wafer W and the support wafer S are bonded to each other, the debris (particles) may be generated and attached to the target wafer W or the support wafer S. In this regard, according to the present exemplary embodiment, the modification surface R1 or R2 is formed by radiating the laser beam into the target wafer W after the target wafer W and the support wafer S are bonded to each other. Therefore, it is possible to suppress the generation of the debris (particles).

Further, even if a void remains in the peripheral portion We when the target wafer W and the support wafer S are bonded to each other, it is possible to remove the void by forming the modification surface R1 or R2 as in the present exemplary embodiment.

As in the above-described exemplary embodiment, the eccentricity detector 97 may be provided in the eccentricity detection device (not shown) outside the processing device 50. In this case, when the combined wafer T is transferred from the eccentricity detection device into the processing unit 90 of the processing device 50 by the wafer transfer device 32, the combined wafer T is transferred to match the center of the target wafer W with the center of the chuck 91 based on the detection result of the eccentricity by the eccentricity detector 97. Thus, the modification layer M can be appropriately formed in the target wafer W as shown in FIG. 16A, and the modification surface R1 or R2 can be appropriately formed within the target wafer W or in the device layer as shown in FIG. 16B.

Further, the processing unit 90 may not be provided with the laser head 94 and the laser head 200 separately, and may be provided with a common head. Otherwise, the laser head 94 and the laser head 200 of the processing unit 90 may be provided in different devices and may be provided in the modification layer forming device and the interface processing device, respectively.

Furthermore, the present exemplary embodiment can also be applied to a case where the second target wafer W2 is further stacked in the combined wafer T as shown in FIG. 9A to FIG. 9D. That is, the eccentricity detector 97 detects the eccentricity of the second target wafer W2 further stacked and bonded to the combined wafer T. Even in this case, the modification surface R1 or R2 can be appropriately formed based on the detection result of the eccentricity of the target wafer W in the combined wafer T. Moreover, if the position of the peripheral portion We to be removed from the second target wafer W2 is matched with the position of the combined wafer T, the forming of the modification surface R1 or R2 may be omitted.

The present exemplary embodiment can also be applied to a case where the peripheral portion We to be removed from the second target wafer W2 as the upper layer is located within the peripheral portion We to be removed from the first target wafer W1 as the lower layer as shown in FIG. 10A and FIG. 10B. However, in this case, as for the second target wafer W2, the modification surface R1 or R2 may be desirably formed in the peripheral portion We to be removed from the first target wafer W1.

In the above-described exemplary embodiment, desirably, all the inner peripheral positions of the modification surfaces R1 and R2 formed in the target wafer W are matched with position of the modification layer M.

Figure 17:
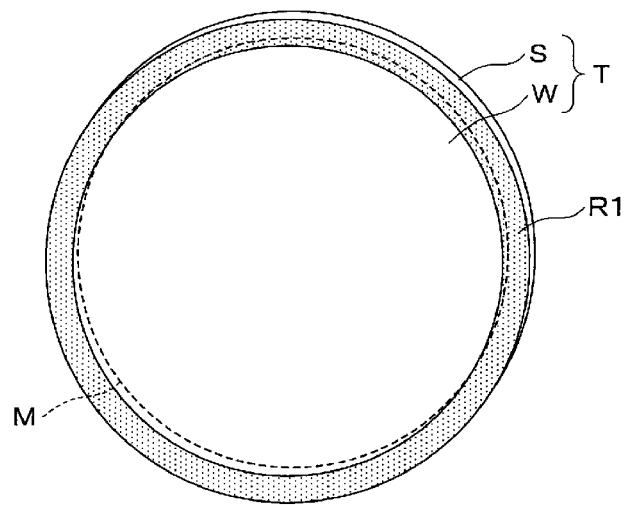
FIG. 17 is a plan view illustrating that the target wafer of the combined wafer is eccentric.

To explain a reason for this, FIG. 17 shows the combined wafer T in which the target wafer W is eccentrically bonded and the position of the modification layer M is not matched with the inner peripheral position of the modification surface R1 as an example. In this case, as shown in FIG. 17, a part of the modification layer M is located more inwards in the diametric direction than an inner periphery of the modification surface R1 and a part of the modification layer M is located more outwards in the diametric direction than the inner periphery of the modification surface R1.

Figure 18A:
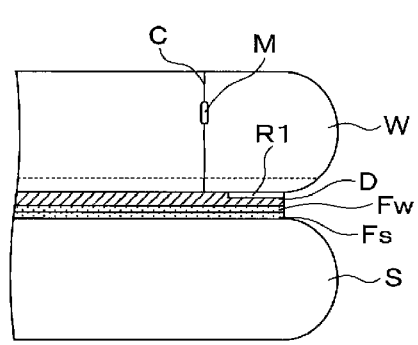
FIG. 18A and FIG. 18B are explanatory diagrams showing that the modification layer is located more inwards in a diametric direction than an inner periphery of the modification surface.
Figure 18B:
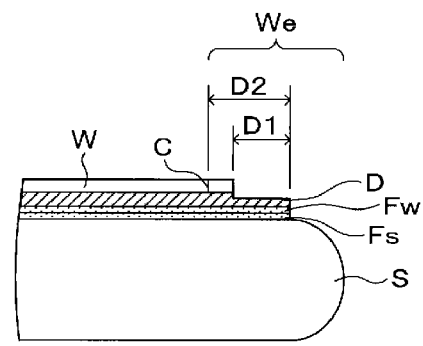

If the modification layer M is located more inwards in the diametric direction than the inner periphery of the modification surface R1 as shown in FIG. 18A, when the peripheral portion We is removed by grinding the processing surface Wg as shown in FIG. 18B, a width D1 of the removed peripheral portion is smaller than a target width D2 of the peripheral portion We to be removed. Also, the removed peripheral portion is peeled off not through the modification layer M and the crack C, so that an outer surface of the target wafer W may be rough after the peripheral portion is removed.

Figure 19A:
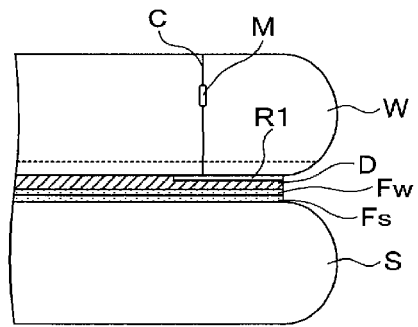
FIG. 19A and FIG. 19B are explanatory diagrams showing that the modification layer is located more outwards in the diametric direction than the inner periphery of the modification surface.
Figure 19B:
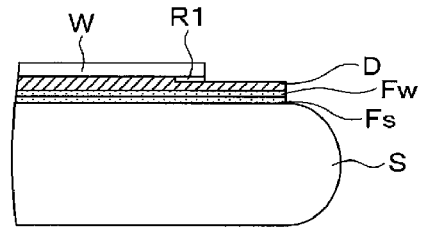

If the modification layer M is located more outwards in the diametric direction than the inner periphery of the modification surface R1 as shown in FIG. 19A, when the peripheral portion We is removed by grinding the processing surface Wg of the target wafer W as shown in FIG. 19B, the modification surface R1 remains between the target wafer W and the device layer D. In a portion where the modification surface R1 remains, the target wafer W may be peeled off from the device layer D, which may cause the chipping.

Examples of the method of solving the mismatch between the position of the modification layer M and the inner peripheral position of the modification surface R1 may include the following two methods. According to a first method of solving the mismatch, the eccentricity of the target wafer W in the combined wafer T is detected and the position of the modification layer M or the inner peripheral position of the modification surface R1 is adjusted based on the result of detection. According to a second method of solving the mismatch, the position of the modification layer M or the inner peripheral position of the modification surface R1 is detected and the position of a modification surface R1 or a modification layer M to be formed in a subsequent processing is adjusted based on the detection result.

Figure 11:
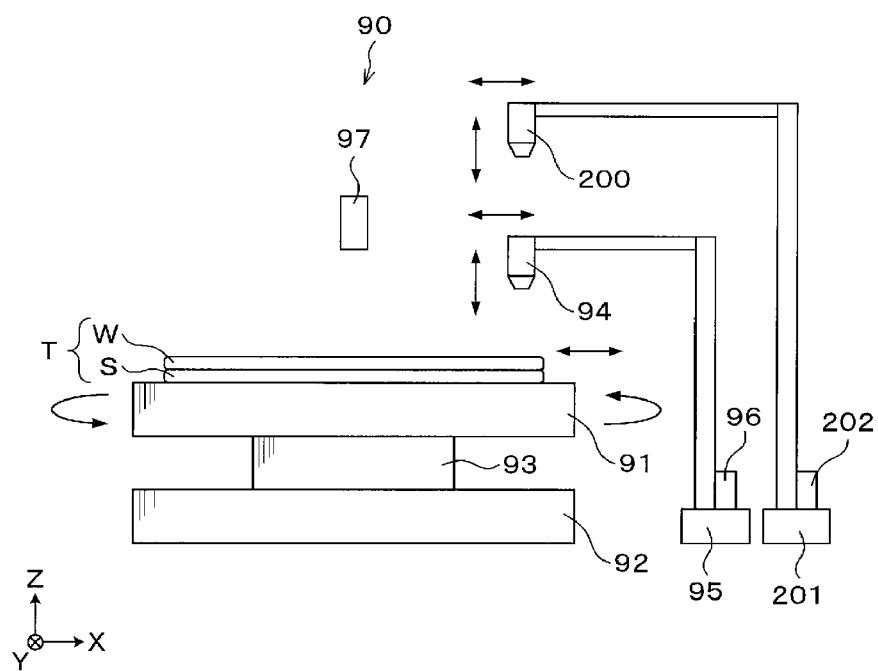
FIG. 11 is a schematic side view illustrating a configuration of a processing unit according to another exemplary embodiment.

According to the first method of solving detection mismatch, the modification layer M and the modification surface R1 are formed in the processing unit 90 shown in FIG. 11 by the method shown in FIG. 16A to FIG. 16D. That is, in the processing unit 90, the eccentricity detector 97 captures the image of the combined wafer T to detect the eccentricity of the target wafer W in the combined wafer T. Then, the central axis of the chuck 91, the irradiation axis of the laser beam L from the laser head 94 or the irradiation axis of the laser beam L from the laser head 200 is adjusted based on the detection result of the eccentricity of the target wafer W. By adjusting the central axis of the chuck 91 or the irradiation axis of the laser head 94, the modification layer M can be appropriately formed in the target wafer W as shown in FIG. 16A. Also, by adjusting the central axis of the chuck 91 or the irradiation axis of the laser head 200, the modification surface R1 can be appropriately formed in the target wafer W as shown in FIG. 16B.

As described above, by adjusting the central axis of the chuck 91, the irradiation axis of the laser head 94 or the irradiation axis of the laser head 200 based on the detection result of the eccentricity of the target wafer W by the eccentricity detector 97, the position of the modification layer M can be matched with the inner peripheral position of the modification surface R1.

Figure 20:
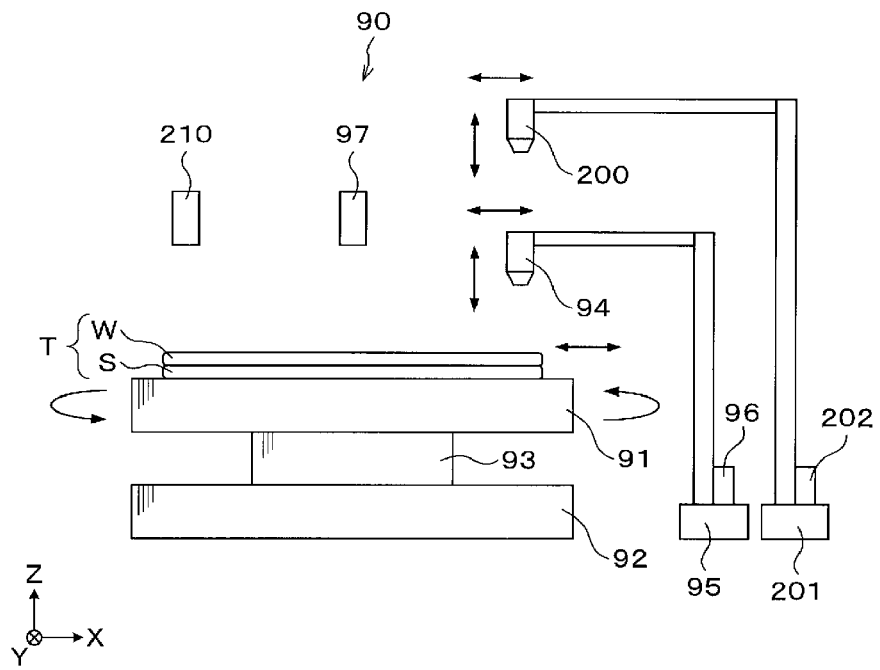
FIG. 20 is a schematic side view illustrating a configuration of a processing unit according to another exemplary embodiment.

The second method for solving the mismatch will be described. In this case, for example, as shown in FIG. 20, the processing unit 90 further includes a position detector 210 in addition to the configuration of the processing unit 90 shown in FIG. 11. The position detector 210 is provided above an outer peripheral portion of the chuck 91. The position detector 210 is configured to be movable in the X-axis direction, in the Y-axis direction and in the Z-axis direction by a moving mechanism (not shown). The position detector 210 may be equipped with, for example, an IR camera using infrared rays. Further, the position detector 210 detects the position of the modification layer M or the inner periphery position of the modification surface R1 formed in the target wafer W in the combined wafer T held on the chuck 91.

The second method for solving the mismatch is performed based on the detection result by the position detector 210 and will be described herein with reference to a case where the wafer processings shown in FIG. 16A to FIG. 16D are performed by the substrate processing system 1.

First, in the processing unit 90, the modification layer M is formed in the target wafer W using the laser head 94 as shown in FIG. 16A.

If the modification layer M is formed in the target wafer W, the modification layer M within the target wafer W is imaged by the position detector 210 to detect the position of the modification layer M. The detection result of the position detector 210 is output to the control device 60.

In the control device 60, the central axis of the chuck 91 or the irradiation axis of the laser head 200 is adjusted based on the detection result by the position detector 210, i.e., based on the position of the modification layer M. Thus, as shown in FIG. 16B, the modification surface R1 can be appropriately formed in the target wafer W. As a result, the position of the modification layer M can be matched with the inner peripheral position of the modification surface R1.

Further, the forming of the modification layer M shown in FIG. 16A and the forming of the modification surface R1 shown in FIG. 16B may be performed in reverse order. In this case, the modification surface R1 is formed in the target wafer W and then, the modification surface R1 is imaged by the position detector 210 with infrared rays to detect the inner peripheral position of the modification surface R1. The detection result by the position detector 210 is output to the control device 60.

In the control device 60, the central axis of the chuck 91 or the irradiation axis of the laser head 94 is adjusted based on the detection result by the position detector 210, i.e., based on the inner peripheral position of the modification surface R1. Thus, the modification layer M can be appropriately formed in the target wafer W. As a result, the position of the modification layer M can be matched with the inner peripheral position of the modification surface R1.

In the processing unit 90 according to the above-described exemplary embodiment, the modification layer M is formed at a single position such that the lower end thereof can be located above the target surface of the target wafer W after being ground as shown in FIG. 4. However, the method of forming the modification layer M is not limited thereto. As shown in FIG. 21A to FIG. 21D, a plurality of modification layers M may be formed in a thickness direction of the target wafer W.

Figure 21A:
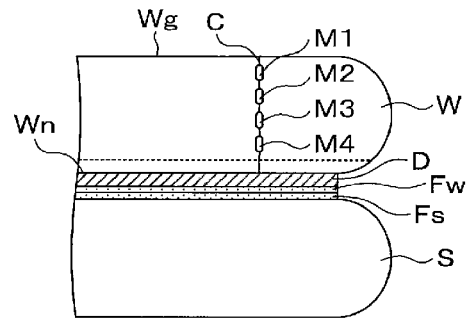
FIG. 21A to FIG. 21D are longitudinal cross sectional views illustrating the modification layer formed in the target wafer according to another exemplary embodiment.

In the example shown in FIG. 21A, modification layers M1 to M4 are formed into a plurality of stages, for example, four stages, in the thickness direction of the target wafer W. A lower end of the lowermost modification layer M4 is located above the target surface (indicated by a dotted line in FIG. 21A) of the target wafer W after being ground. Also, the crack C extending from these modification layers M1 to M4 reaches the processing surface Wg and the non-processing surface Wn of the target wafer W.

Figure 21B:
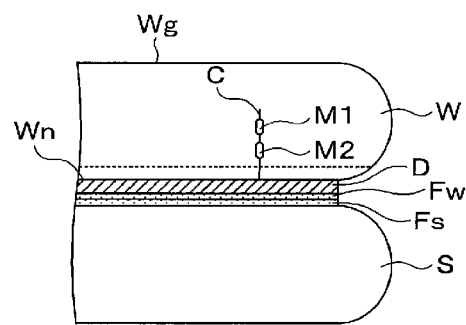

In the example shown in FIG. 21B, modification layers M1 and M2 are formed into a plurality of stages, for example, two stages, in the thickness direction of the target wafer W. A lower end of the lower modification layer M2 is located above the target surface (indicated by a dotted line in FIG. 21B) of the target wafer W after being ground. Also, the crack C extending from these modification layers M1 and M2 reaches the non-processing surface Wn of the target wafer W, but does not reach the processing surface Wg. In this case, for example, when the rough grinding whetstone 132 is lowered to grind the processing surface Wg in the rough grinding unit 130, the processing surface Wg including the peripheral portion We of the target wafer W is ground until a grinding surface of the rough grinding whetstone 132 reaches the crack C. Then, when the grinding surface of the rough grinding whetstone 132 reaches the crack C, the peripheral portion We located under the crack C is peeled off to be removed. As such, a height of an upper end of the crack C elongated from the modification layers M1 and M2 is adjusted to a predetermined position, and, thus, the size (height) of segments of the peripheral portion We to be removed can be controlled.

Figure 21C:
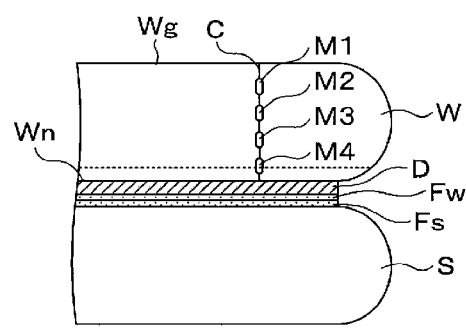

In the example shown in FIG. 21C, modification layers M1 to M4 are formed into a plurality of stages, for example, four stages, in the thickness direction of the target wafer W. A lower end of the lowermost modification layer M4 is located under the target surface (indicated by a dotted line in FIG. 21C) of the target wafer W after being ground. Also, the crack C extending from these modification layers M1 to M4 reaches the processing surface Wg and the non-processing surface Wn of the target wafer W. In this case, the modification layer M4 is formed at the boundary between the peripheral portion We and the central portion Wc of the target wafer W after being ground, and, thus, the peripheral portion We can be more reliably peeled off to be removed. Further, if the modification layer M4 is formed under the target surface as described above, the focusing of the laser beam is blurred to make it difficult to generate the crack C extending from the modification layer M4. Thus, it is possible to suppress the generation of the crack C even in the support wafer S bonded to the target wafer W. The position of the crack C changes in the entire circumferential direction, but the lower end of the modification layer M4 can be controlled as such. Therefore, it can be removed with high accuracy.

Figure 21D:
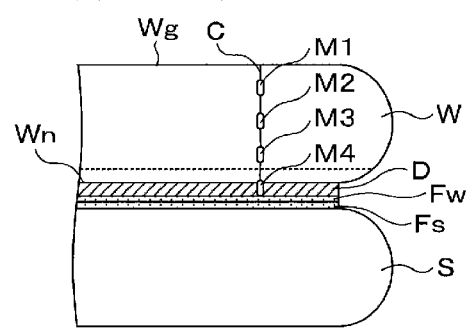

In the example shown in FIG. 21D, modification layers M1 to M4 are formed into a plurality of stages, for example, four stages, in the thickness direction of the target wafer W. A lower end of the lowermost modification layer M4 is located within the device layer D. Also, the crack C extending from these modification layers M1 to M4 reaches the processing surface Wg of the target wafer W. Even in this case, the modification layer M4 is formed at the boundary between the peripheral portion We and the central portion Wc of the target wafer W after being ground, and, thus, the peripheral portion We can be more reliably peeled off to be removed.

Further, as described above with reference to FIG. 14, if the modification surface R2 is formed in the device layer D, the ablation of the device layer D in the peripheral portion We may affect the device layer D in the central portion Wc within the peripheral portion We. In this case, as shown in FIG. 21D, it is desirable to form the modification layer M4 in the device layer D and then form the modification surface R2. The modification layer M4 functions to stop the effect of the ablation and thus can reliably suppress the effect of ablation on the central portion Wc.

Figure 22A:
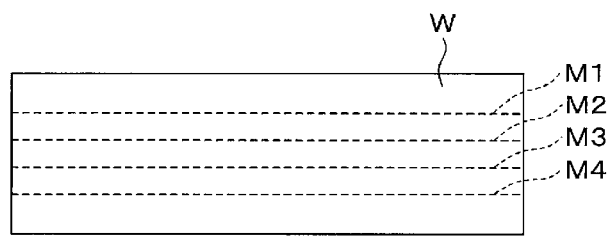
FIG. 22A to FIG. 22C are explanatory diagrams showing that the modification layer is formed in the target wafer according to yet another exemplary embodiment.
Figure 22B:
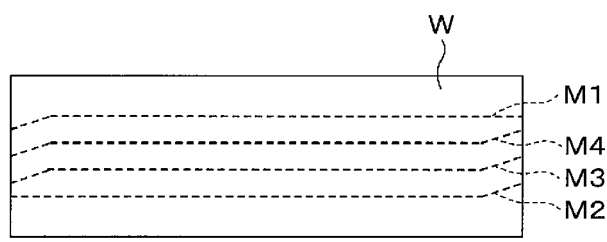
Figure 22C:
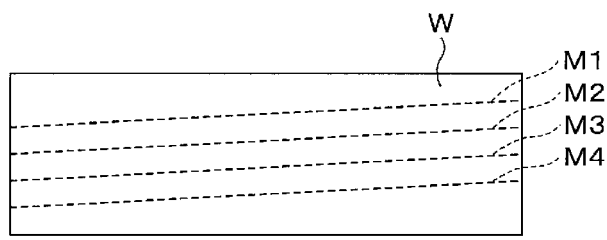

The method of forming modification layers M in the thickness direction of the target wafer W as shown in FIG. 21A to FIG. 21D is arbitrary, but may include, for example, three processing methods as shown in FIG. 22A to FIG. 22C. FIG. 22A to FIG. 22C are plan views of a portion (a boundary between the peripheral portion We and the central portion Wc) where the modification layers M are formed in the target wafer W. That is, in FIG. 22A to FIG. 22C, the horizontal direction indicates the circumferential direction of the boundary between the peripheral portion We and the central portion Wc and the vertical direction indicates the thickness direction of the target wafer W. Also, in FIG. 22A to FIG. 22C, dotted lines indicate modification layers M1 to M4 and show that the modification layers M1 to M4 are formed in the thickness direction of the target wafer W.

According to a processing method shown in FIG. 22A, in the processing unit 90, while the chuck 91 is rotated by the rotation mechanism 93, the laser beam is radiated from the laser head 94 fixed in the vertical direction into the target wafer W to form the annular modification layer M4. Then, the rotation of the chuck 91 is stopped and the irradiation of the laser beam from the laser head 94 is stopped and then, the laser head 94 is moved up by the elevation mechanism 96 to a predetermined position, i.e., a position where the modification layer M3 is formed. Thereafter, while the chuck 91 is rotated, the laser beam is radiated from the laser head 94 to form the annular modification layer M3. Here, the modification layers M2 and M1 are formed in the same manner, and, thus, the modification layers M1 to M4 are formed in the target wafer W.

Further, when the modification layers M1 to M4 are formed, the irradiation of the laser beam from the laser head 94 may be controlled to be ON/OFF while the chuck 91 is continuously rotated. For example, while the chuck 91 is rotated, the laser beam is radiated from the laser head 94 into the target wafer W to form the modification layer M4. Then, while the chuck 91 is continuously rotated, the irradiation of the laser beam from the laser head 94 is stopped. Subsequently, the laser head 94 is moved up and the laser head 94 radiates the laser beam into the target wafer W to form the modification layer M3. Here, the irradiation start position and the irradiation end position of the laser beam for forming the modification layer M4 are stored, and, thus, the irradiation start position and the irradiation end position of the laser beam for subsequently forming the modification layer M3 can be adjusted. Further, since the rotation of the chuck 91 is not stopped as described above, the irradiation waiting time of the laser beam during the rotation acceleration and the rotation deceleration of the chuck 91 can be reduced, and, thus, the entire processing time can be reduced. Furthermore, since the rotation speed of the chuck 91 is maintained constant, the laser processing can be performed uniformly, and, thus, pitches of the modification layers M in the horizontal direction can be made equal.

According to a processing method shown in FIG. 22B, while the chuck 91 is rotated by the moving mechanism 92, the laser beam is radiated from the laser head 94 fixed in the vertical direction into the target wafer W to form an annular modification layer M4. Before the forming of the modification layer M4 is ended, the laser head 94 is moved up by the elevation mechanism 96 to a predetermined position, i.e., a position where the modification layer M3 is formed, while the chuck 91 is continuously rotated and the laser beam from the laser head 94 is continuously radiated. Then, in a state where the position of the laser head 94 in the vertical direction is fixed, the laser beam is radiated from the laser head 94 while the chuck 91 is rotated to form the annular modification layer M3. Here, the modification layers M2 and M1 are formed in the same manner, and, thus, the modification layers M1 to M4 are formed in the target wafer W. In this case, the modification layers M1 to M4 can be consecutively formed, and, thus, the processing time can be reduced compared with the processing method shown in FIG. 22A.

According to a processing method shown in FIG. 22C, while the chuck 91 is rotated by the rotation mechanism 93 and the laser head 94 is moved up by the elevation mechanism 96, the laser beam is radiated from the laser head 94 into the target wafer W. Then, the annular modification layers M1 to M4 are consecutively formed. That is, in the present processing method, the modification layers M1 to M4 are consecutively formed into a spiral shape. Even in this case, the modification layers M1 to M4 can be consecutively formed, and, thus, the processing time can be reduced compared with the processing method shown in FIG. 22A. Also, the modification layers M1 to M4 do not have a steep slope when viewed from the side and thus can be uniformly formed in the vertical direction (the thickness direction of the target wafer W) compared with the processing method shown in FIG. 22B.

Figure 23:
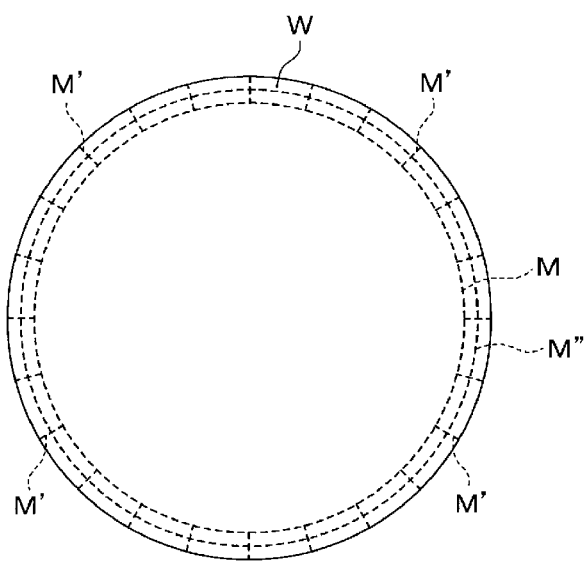
FIG. 23 is a plan view illustrating the modification layer formed in the target wafer according to still yet another exemplary embodiment.

According to the above-described exemplary embodiments, in the processing unit 90, the annular modification layer M is formed within the target wafer W. However, as shown in FIG. 23, a plurality of diametric directional modification layers M' elongated outwards in the diametric direction from the annular modification layer M may be further formed. In this case, for example, if the peripheral portion We is removed in the processing unit 90, the peripheral portion We is peeled off starting from the annular modification layer M and divided into a plurality of segments by the diametric directional modification layers M'. Thus, the peripheral portion We to be removed decreases in size and can be easily removed.

Further, to segment the peripheral portion We (edge segment) to be removed when the processing surface Wg is ground, a plurality of divided annular modification layers M" may be formed at a certain distance in a concentric direction with respect to the modification layer M as shown in FIG. 23. In this case, the size of the peripheral portion We to be removed can be further reduced. Also, by controlling the distance between the divided modification layers M" in the diametric direction, the size of segments of the peripheral portion We to be removed can be controlled.

Figure 24:
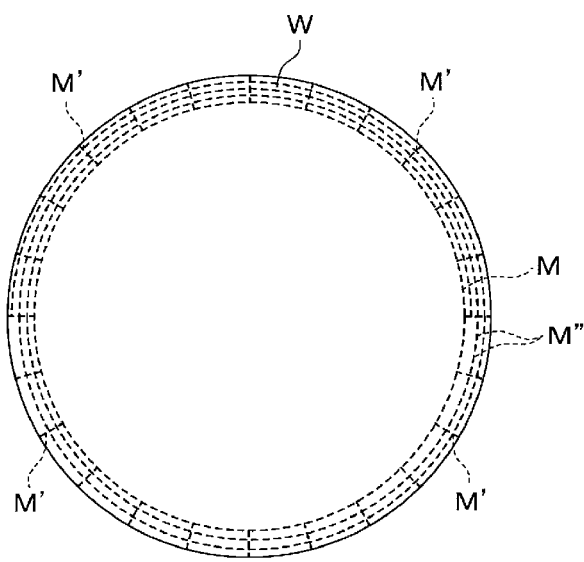
FIG. 24 is a plan view illustrating the modification layer formed in the target wafer according to still yet another exemplary embodiment.

Furthermore, if the divided annular modification layers M" are formed as described above, the divided modification layers M" may be formed into a spiral shape when viewed form the top as shown in FIG. 24. In this case, in the processing unit 90, while the chuck 91 or the laser head 94 is moved in the horizontal direction and the chuck 91 is rotated, the laser beam is radiated from the laser head 94 to the target wafer W. Thus, the divided modification layers M" can be consecutively formed into the spiral shape. As a result, it is possible to reduce the processing time.

Figure 25:
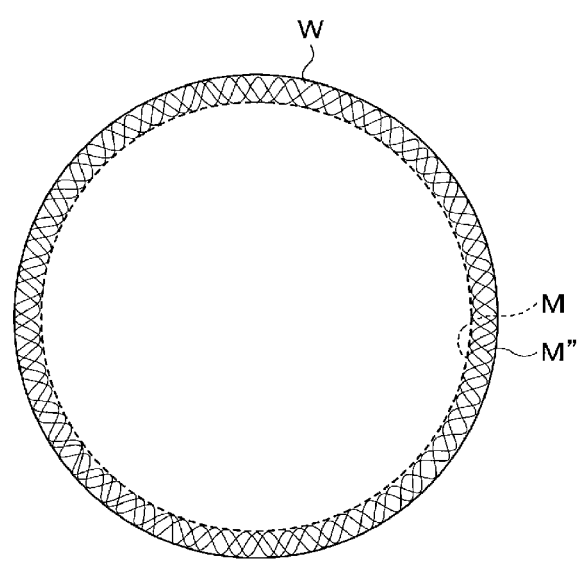
FIG. 25 is a plan view illustrating the modification layer formed in the target wafer according to still yet another exemplary embodiment.

Otherwise, the divided modification layers M" may be formed into a spiral shape and a zigzag shape when viewed from the top as shown in FIG. 25. In this case, in the processing unit 90, while the chuck 91 or the laser head 94 is moved in the horizontal direction and the chuck 91 is rotated, the laser beam is radiated from the laser head 94 to the target wafer W. Here, the phase, the cycle and the amplitude of the movement of the chuck 91 or the laser head 94 are controlled, and, thus, the divided modification layers M" can be formed into the zigzag wave shape. Further, the divided modification layers M" are formed into two or more turns. Also, by controlling a shift and the number of turns of zigzag phases of the divided modification layers M", the size of segments of the peripheral portion We to be removed can be controlled. Further, in the present exemplary embodiment, the diametric directional modification layers M' shown in FIG. 23 and FIG. 24 are not necessary.

Figure 26A:
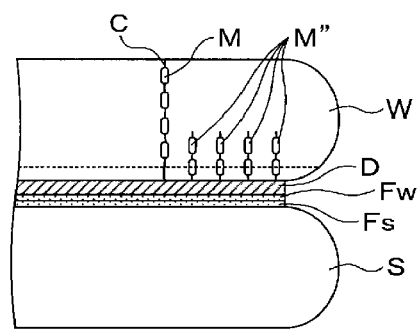
FIG. 26A and FIG. 26B are longitudinal cross sectional views illustrating the modification layer formed in the target wafer according to still yet another exemplary embodiment.
Figure 26B:
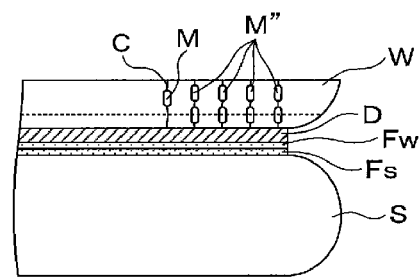

Furthermore, the divided modification layers M" may be formed such that the crack C extending from the divided modification layers M" can be elongated to a predetermined position within the target wafer W as shown in FIG. 26A. That is, the crack C reaches the non-processing surface Wn of the target wafer W, but does not reach the processing surface Wg. In this case, for example, when the rough grinding whetstone 132 is lowered to grind the processing surface Wg in the rough grinding unit 130, the processing surface Wg including the peripheral portion We of the target wafer W is ground as shown in FIG. 26B until the grinding surface of the rough grinding whetstone 132 reaches the crack C. Then, when the grinding surface of the rough grinding whetstone 132 reaches the crack C, the peripheral portion We located under the crack C is peeled off to be removed. As such, the height of the upper end of the crack C is adjusted to a predetermined position, and, thus, the size (height) of segments of the peripheral portion We to be removed can be controlled. Further, in the example shown in FIG. 26A and FIG. 26B, the divided modification layers M" are formed into two stages. However, by setting the number of focusing points from the laser head 94 to two, the divided modification layers M" can be simultaneously formed into two stages while the chuck 91 is rotated.

Further, the configuration of the substrate processing system 1 of the present disclosure is not limited to the present exemplary embodiments. For example, each of the laser head 94 configured to form the modification layer M and the laser head 200 configured to form the modification surface R1 or R2 are provided in the processing unit 90 configured to perform the alignment of the combined wafer T, but the configuration of the device is not limited thereto. In the processing device 50, the modification layer forming unit configured to form the modification layer M and the interface processing unit configured to form the modification surface R1 or R2 may be separately provided in the processing unit 90. The modification layer forming unit is equipped with the laser head 94, the moving mechanism 95 and the elevation mechanism 96. The interface processing unit is equipped with the laser head 200, the moving mechanism 201 and the elevation mechanism 202. Also, the modification layer forming unit and the interface processing unit may be provided at any position within the range in which the transfer unit 80 can transfer the combined wafer T. For example, the modification layer forming unit and the interface processing unit may be provided to be stacked on the processing unit 90. Otherwise, the modification layer forming unit and the interface processing unit may be provided at a position adjacent to the processing unit 90 in the horizontal direction, for example, at a position opposite to the processing unit 90 with respect to the moving mechanism 83. Alternatively, any one of the modification layer forming unit and the interface processing unit may be placed within the processing device 50. Otherwise, both the modification layer forming unit and the interface processing unit may be placed outside the processing device 50.

Furthermore, in the substrate processing system 1 according to the present exemplary embodiment, a chemical mechanical polishing (CMP) device configured to polish the processing surface Wg of the target wafer W may be provided. In this case, a cleaning device configured to clean the processing surface Wg after being polished may also be provided. The CMP device may be provided, for example, on the negative side of the Y-axis direction of the wafer transfer section 30 in the processing station 3. Also, the cleaning device may be stacked on the wet etching devices 40 and 41, for example, on the positive side of the X-axis direction of the wafer transfer section 30.

Moreover, in the substrate processing system 1 according to the present exemplary embodiment, the target wafer W and the support wafer S are bonded to each other by the bonding device outside the substrate processing system 1. However, the bonding device may be provided within the substrate processing system 1. In this case, cassettes Ct configured to accommodate therein a plurality of target wafers W, a plurality of support wafers S and a plurality of combined wafers T, respectively, are carried into and out of the carry-in/out station 2. Furthermore, these cassettes Ct can be arranged in a row in the Y-axis direction on the cassette mounting table 10.

The bonding device is configured to bond the non-processing surface Wn of the target wafer W to the bonding surface Sj of the support wafer S by van der Waals forces and hydrogen bond (intermolecular force). Desirably, each of the non-processing surface Wn and the bonding surface Sj is modified and hydrophilized during the bonding process. Specifically, when the non-processing surface Wn and the bonding surface Sj are modified, an oxygen gas or nitrogen gas as a processing gas is formed into plasma and ionized, for example, under a decompressed atmosphere. The oxygen ions or nitrogen ions are radiated onto the non-processing surface Wn and the bonding surface Sj, and, thus, the non-processing surface Wn and the bonding surface Sj are plasma-processed and activated. Also, pure water is supplied onto the modified non-processing surface Wn and bonding surface Sj to hydrophilize the non-processing surface Wn and the bonding surface Sj. The configuration of the bonding device is arbitrary, and a bonding device known in the art may be used.

According to the above-described exemplary embodiments, in the rough grinding unit 130 (or the rough grinding unit 130 and the intermediate grinding unit 140), the peripheral portion We of the target wafer W is removed, but the configuration of the periphery removing device is not limited thereto. For example, after the modification layer M is formed in the target wafer W, a force is applied to the outside of the modification layer M to remove the peripheral portion We. As such, the method of applying the force is arbitrary, but an impact is applied to the peripheral portion We, for example, by bringing a whetstone wheel (not shown) or a blade (not shown), into contact with the peripheral portion We. Otherwise, water pressure or air pressure is applied to the peripheral portion We. Further, a tape (not shown) is attached to the peripheral portion We and pulled off from the peripheral portion We. Due to such an external force, the peripheral portion We is peeled off to be removed starting from the modification layer M and the crack C.

In the above-described exemplary embodiments, there has been described a case where the target wafer W and the support wafer S are directly bonded to each other. However, the target wafer W and the support wafer S may be bonded to each other via an adhesive.

The exemplary embodiments disclosed herein are illustrative and do not limit the present disclosure. Further, the above-described exemplary embodiments may be omitted, substituted, or changed in various forms without departing from the scope and spirit of the appended claims.

EXPLANATION OF CODES

According to the present disclosure, the peripheral portion of one of substrates which are bonded to each other to form the combined substrate can be appropriately removed.

I claim:

1. A substrate processing system configured to process a substrate, comprising:
   an eccentricity detection device configured to detect, in a combined substrate in which a first substrate and a second substrate are bonded to each other, an eccentricity of the first substrate;
   a modification layer forming device configured to form a modification layer within the first substrate along a boundary between a peripheral portion to be removed and a central portion of the first substrate;
   a periphery removing device configured to remove the peripheral portion starting from the modification layer; and
   a control device configured to control the eccentricity detection device, the modification layer forming device and the periphery removing device,
   wherein the modification layer forming device includes a holder configured to hold the combined substrate and a modifying unit configured to form the modification layer within the first substrate in the combined substrate held on the holder, and
   the control device adjusts a center of the first substrate in the combined substrate held on the holder based on a detection result by the eccentricity detection device in a processing performed by the modifying unit.

2. The substrate processing system of claim 1,
   wherein the modifying unit radiates a laser beam into the first substrate to form the modification layer, and
   the control device adjusts a central axis of the holder or an irradiation axis of the laser beam radiated from the modifying unit based on the detection result by the eccentricity detection device.

3. The substrate processing system of claim 1, further comprising:
   a transfer device configured to transfer the combined substrate with respect to the eccentricity detection device, the modification layer forming device and the periphery removing device,
   wherein the control device controls the transfer device to transfer the combined substrate onto the holder to match the center of the first substrate with a center of the holder based on the detection result by the eccentricity detection device.

4. The substrate processing system of claim 1, wherein the periphery removing device includes a grinding unit configured to grind a non-bonding surface of the first substrate and a processing unit configured to perform position adjustment of the combined substrate, the holder and the modifying unit of the modification layer forming device are provided in the processing unit, and
the control device controls the processing unit based on the detection result by the eccentricity detection device.

5. A substrate processing system configured to process a substrate, comprising:
an eccentricity detection device configured to detect, in a combined substrate in which a first substrate and a second substrate are bonded to each other, an eccentricity of the first substrate;
a modification layer forming device configured to form a modification layer within the first substrate along a boundary between a peripheral portion to be removed and a central portion of the first substrate;
a periphery removing device configured to remove the peripheral portion starting from the modification layer;
a control device configured to control the eccentricity detection device, the modification layer forming device and the periphery removing device; and
an interface processing device including an additional holder configured to hold the combined substrate and an interface processing unit configured to modify an interface between the peripheral portion of the first substrate and the second substrate in the combined substrate held on the additional holder,
wherein the control device is further configured to control the interface processing device, and
the control device adjusts a center of the first substrate in the combined substrate held on the additional holder based on a detection result by the eccentricity detection device in a processing performed by the interface processing unit.

6. The substrate processing system of claim 5, wherein the interface processing unit radiates a laser beam to the interface to modify the interface, and
the control device adjusts a central axis of the additional holder or an irradiation axis of the laser beam radiated from the interface processing unit based on the detection result by the eccentricity detection device.

7. The substrate processing system of claim 5, further comprising:
a transfer device configured to transfer the combined substrate with respect to the eccentricity detection device, the modification layer forming device, the periphery removing device and the interface processing device,
wherein the control device controls the transfer device to transfer the combined substrate to the additional holder to match the center of the first substrate with a center of the additional holder based on the detection result by the eccentricity detection device.

8. The substrate processing system of claim 5, wherein the periphery removing device includes a grinding unit configured to grind a non-bonding surface of the first substrate and a processing unit configured to perform position adjustment of the combined substrate, the additional holder and the interface processing unit of the interface processing device are provided in the processing unit, and
the control device controls the processing unit based on the detection result by the eccentricity detection device.

9. A substrate processing system configured to process a substrate, comprising:
an eccentricity detection device configured to detect, in a combined substrate in which a first substrate and a second substrate are bonded to each other, an eccentricity of the first substrate;
a modification layer forming device configured to form a modification layer within the first substrate along a boundary between a peripheral portion to be removed and a central portion of the first substrate;
a periphery removing device configured to remove the peripheral portion starting from the modification layer;
a control device configured to control the eccentricity detection device, the modification layer forming device and the periphery removing device; and
a bonding device configured to bond the first substrate and the second substrate to each other.

10. A substrate processing system configured to process a substrate, comprising:
an eccentricity detection device configured to detect, in a combined substrate in which a first substrate and a second substrate are bonded to each other, an eccentricity of the first substrate;
a modification layer forming device configured to form a modification layer within the first substrate along a boundary between a peripheral portion to be removed and a central portion of the first substrate;
a periphery removing device configured to remove the peripheral portion starting from the modification layer; and
a control device configured to control the eccentricity detection device, the modification layer forming device and the periphery removing device,
wherein the eccentricity detection device detects an eccentricity of a third substrate stacked on the first substrate in the combined substrate,
the modification layer forming device forms a modification layer within the third substrate along a boundary between a peripheral portion to be removed and a central portion of the third substrate, and
the periphery removing device removes the peripheral portion of the third substrate starting from the modification layer in the third substrate.

11. A substrate processing method of processing a substrate, comprising:
detecting, in a combined substrate in which a first substrate and a second substrate are bonded to each other, an eccentricity of the first substrate;
forming a modification layer within the first substrate along a boundary between a peripheral portion to be removed and a central portion of the first substrate; and
removing the peripheral portion starting from the modification layer,
wherein in the forming of the modification layer within the first substrate, the modification layer is formed within the first substrate in the combined substrate held on a holder by a modifying unit,
wherein before the forming of the modification layer within the first substrate is performed, a center of the first substrate in the combined substrate held on the holder is adjusted based on a detection result of the detecting of the eccentricity of the first substrate in a processing performed by the modifying unit, and wherein before the forming of the modification layer within the first substrate is performed, the combined substrate is transferred onto the holder to match the center of the first substrate with a center of the holder based on the detection result of the detecting of the eccentricity of the first substrate.

12. The substrate processing method of claim 11, wherein in the forming of the modification layer within the first substrate, the modifying unit radiates a laser beam into the first substrate to form the modification layer, and before the forming of the modification layer within the first substrate is performed, a central axis of the holder or an irradiation axis of the laser beam radiated from the modifying unit is adjusted based on the detection result of the detecting of the eccentricity of the first substrate.

13. The substrate processing method of claim 11, wherein in the removing of the peripheral portion, by allowing a processing unit to perform position adjustment of the combined substrate and then allowing a grinding unit to grind a non-bonding surface of the first substrate, the peripheral portion is removed, the holder and the modifying unit are provided in the processing unit, and the center of the first substrate in the combined substrate held on the holder is adjusted based on the detection result of the detecting of the eccentricity of the first substrate by the processing unit in a processing performed by the modifying unit.

14. The substrate processing method of claim 11, further comprising:

stacking and bonding a third substrate onto the first substrate after the removing of the peripheral portion;

detecting an eccentricity of the third substrate stacked on the first substrate in the combined substrate;

forming a modification layer within the third substrate along a boundary between a peripheral portion to be removed and a central portion of the third substrate; and removing the peripheral portion of the third substrate starting from the modification layer in the third substrate.

15. A substrate processing method of processing a substrate, comprising:

detecting, in a combined substrate in which a first substrate and a second substrate are bonded to each other, an eccentricity of the first substrate;

forming a modification layer within the first substrate along a boundary between a peripheral portion to be removed and a central portion of the first substrate;

removing the peripheral portion starting from the modification layer; and modifying an interface between the peripheral portion of the first substrate and the second substrate in the combined substrate held on an additional holder by an interface processing unit, wherein before the modifying of the interface is performed, a center of the first substrate in the combined substrate held on the additional holder is adjusted based on a detection result of the detecting of the eccentricity of the first substrate in a processing performed by the interface processing unit.

16. The substrate processing method of claim 15, wherein in the modifying of the interface, the interface processing unit radiates a laser beam to the interface to modify the interface, and before the modifying of the interface is performed, a central axis of the additional holder or an irradiation axis of the laser beam radiated from the interface processing unit is adjusted based on the detection result of the detecting of the eccentricity of the first substrate.

17. The substrate processing method of claim 15, wherein before the modifying of the interface is performed, the combined substrate is transferred to the additional holder to match the center of the first substrate with a center of the additional holder based on the detection result of the detecting of the eccentricity of the first substrate.

18. The substrate processing method of claim 15, wherein in the removing of the peripheral portion, by allowing a processing unit to perform position adjustment of the combined substrate and then allowing a grinding unit to grind a non-bonding surface of the first substrate, the peripheral portion is removed, the additional holder and the interface processing unit are provided in the processing unit, and the center of the first substrate in the combined substrate held on the additional holder is adjusted based on the detection result of the detecting of the eccentricity of the first substrate by the processing unit in a processing performed by the interface processing unit.

* * * * *